United States Patent
Moon et al.

(10) Patent No.: US 9,935,086 B2
(45) Date of Patent: Apr. 3, 2018

(54) PACKAGE SUBSTRATE AND LIGHT EMITTING DEVICE PACKAGE

(71) Applicant: SAMSUNG ELECTRONICS CO., LTD., Suwon-si (KR)

(72) Inventors: Sung Hyun Moon, Yongin-si (KR); Seong Jae Hong, Hwaseong-si (KR); Kyu Jong Cho, Hwaseong-si (KR); Seung Won Kang, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/342,200

(22) Filed: Nov. 3, 2016

(65) Prior Publication Data

US 2017/0256520 A1   Sep. 7, 2017

(30) Foreign Application Priority Data

Mar. 3, 2016   (KR) .................. 10-2016-0025680

(51) Int. Cl.
| | |
|---|---|
| *H01L 29/18* | (2006.01) |
| *H01L 33/00* | (2010.01) |
| *H01L 25/075* | (2006.01) |
| *H01L 33/62* | (2010.01) |

(52) U.S. Cl.
CPC .......... *H01L 25/0753* (2013.01); *H01L 33/62* (2013.01)

(58) Field of Classification Search
USPC ..... 257/13, 40, 79–103, 191, 918, 432–437, 257/749, E33.056–E33.059, E25.032, 257/116, 117
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| KR | 101202175 B1 | 11/2012 |
| KR | 101396586 B1 | 5/2014 |

(Continued)

*Primary Examiner* — Tram H Nguyen
(74) *Attorney, Agent, or Firm* — Sughrue Mion, PLLC

(57) ABSTRACT

Provided are a package substrate and a light emitting device package. The package substrate may include a base substrate having a plurality of mounting regions and a plurality of unit light emitting regions which include at least one of the plurality of mounting regions, a plurality of first circuit patterns disposed on the base substrate and connected to a plurality of light emitting devices in the plurality of mounting regions, a plurality of second circuit patterns connected to the plurality of unit light emitting regions, and a wire electrically connecting the plurality of second circuit patterns to the plurality of second circuit patterns, each of the plurality of second circuit patterns being connected to different unit light emitting regions, or electrically connecting the plurality of first circuit patterns to the plurality of second circuit patterns.

20 Claims, 20 Drawing Sheets

(56) References Cited

U.S. PATENT DOCUMENTS

| | | | |
|---|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,421,094 B2 | 4/2013 | Ishizaki et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,046,226 B2 * | 6/2015 | Shimozawa ............ F21K 9/56 |
| 9,673,254 B2 * | 6/2017 | Oh ........................ H01L 27/156 |
| 2011/0316011 A1 * | 12/2011 | Ito ........................ H01L 25/167 |
| | | | 257/88 |
| 2013/0105827 A1 * | 5/2013 | Kim ........................ H01L 27/15 |
| | | | 257/88 |
| 2013/0306997 A1 * | 11/2013 | Lim ...................... H01L 27/156 |
| | | | 257/88 |
| 2014/0131657 A1 * | 5/2014 | Kim ........................ H01L 33/06 |
| | | | 257/13 |
| 2015/0029712 A1 | 1/2015 | Nakamura et al. |
| 2015/0176820 A1 * | 6/2015 | Abe ........................ F21V 9/08 |
| | | | 362/235 |

FOREIGN PATENT DOCUMENTS

| KR | 1020140056881 A | 5/2014 |
| KR | 101563281 B1 | 10/2015 |

* cited by examiner

PACKAGE SUBSTRATE AND LIGHT EMITTING DEVICE PACKAGE

CROSS-REFERENCE TO RELATED APPLICATION

This application claims priority from Korean Patent Application No. 10-2016-0025680, filed on Mar. 3, 2016 in the Korean Intellectual Property Office, the disclosure of which is incorporated herein by reference in its entirety.

BACKGROUND

1. Field

Apparatuses consistent with example embodiments relate to a package substrate and a light emitting device package.

2. Description of Related Art

Semiconductor light emitting devices include devices such as light emitting diodes (LEDs), and have various advantages, such as low power consumption, high degrees of brightness, and relatively long lifespans. Semiconductor light emitting devices are used in various fields, and an application of semiconductor light emitting devices as light sources is gradually increasing. Recently, various use of semiconductor light emitting devices except for general light emitting devices, such as backlight units or lighting devices, have been researched.

SUMMARY

Example embodiments may provide a package substrate and a light emitting device package that may be adopted for use in various operating conditions by forming a plurality of mounting regions and a plurality of connecting lines provided on a substrate and selectively connecting at least one of the plurality of connecting lines to other connecting lines or other mounting regions by a wire.

According to an aspect of example embodiment, there is provided a package substrate, the package substrate may include: a base substrate having a plurality of mounting regions and a plurality of unit light emitting regions which include at least one of the plurality of mounting regions, a plurality of first circuit patterns disposed on the base substrate and connected to a plurality of light emitting devices in the plurality of mounting regions, a plurality of second circuit patterns connected to the plurality of unit light emitting regions, and a wire electrically connecting the plurality of second circuit patterns to the plurality of second circuit patterns, each of the plurality of second circuit patterns being connected to the unit light emitting regions, or electrically connecting the plurality of first circuit patterns to the plurality of second circuit patterns.

According to another aspect of an example embodiment, there is provided a light emitting device package, the light emitting device package may include a plurality of light emitting devices and a package substrate having a plurality of first circuit patterns which provides a plurality of unit light emitting regions in which the plurality of light emitting devices are disposed, a plurality of second circuit patterns connected to at least one of the plurality of first circuit patterns, and a wire connecting at least one of the plurality of second circuit patterns to at least one of the plurality of first circuit patterns and the plurality of second circuit patterns.

According to another aspect of an example embodiment, there is provided a package substrate, the package substrate may include a base substrate having a plurality of mounting regions and a plurality of unit light emitting regions which include at least one of the plurality of mounting regions, a plurality of first circuit patterns disposed on the base substrate and connected to a plurality of light emitting devices in the plurality of mounting regions, a plurality of second circuit patterns connected to the plurality of unit light emitting regions, and a wire selectively connecting the plurality of second circuit patterns to the plurality of second circuit patterns and the plurality of first circuit patterns.

BRIEF DESCRIPTION OF DRAWINGS

The above and other aspects, features, and advantages of the example embodiments will be more clearly understood from the following detailed description taken in conjunction with the accompanying drawings, in which.

DETAILED DESCRIPTION OF THE EXAMPLE EMBODIMENTS

Figure 1:
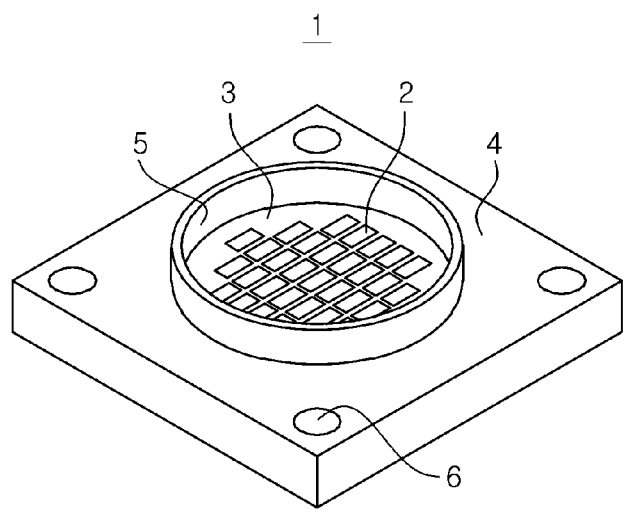
FIG. 1 is a perspective view illustrating a light emitting device package according to an example embodiment.

Various example embodiments of the inventive concept will now be described more fully with reference to the accompanying drawings. The inventive concept may, however, be embodied in different forms and should not be construed as limited to the example embodiments set forth herein. Rather, these example embodiments are provided so that this disclosure is thorough and complete and fully conveys the inventive concept to those skilled in the art. In the drawings, the sizes and relative sizes of layers and regions may be exaggerated for clarity.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view illustrating a light emitting device package according to an example embodiment.

Referring to FIG. 1, a light emitting device package 1 according to an example embodiment may be a chip on board (COB) package. The light emitting device package 1 may include a plurality of light emitting devices 2 and a package substrate 4 on which the light emitting devices 2 may be mounted. The light emitting devices 2 may be disposed in a light emitting region 3 defined by a cavity 5 formed in the package substrate 4. In addition, at least one fixing portion may be provided in the package substrate 4 to secure the light emitting device package 1 to an external module.

The light emitting devices 2 may be electrically connected to a circuit pattern provided on the package substrate 4 by a wire bonding or a flip-chip bonding. If wire bonding is used, the light emitting devices 2 may have an epi-up structure. When wire bonding is employed, a serial/parallel connection structure between the light emitting devices 2 may also be freely changed. Thus, even when specifications of a device to which the light emitting device package 1 is to be applied are changed, the device may respond to the changed specifications only by altering wire bonding without a redesign of the package substrate 4 itself.

Meanwhile, if flip-chip bonding is used, the light emitting device package 1 may be implemented using the light emitting devices 2 having a relatively high optical output, as compared to wire bonding. In addition, when flip-chip bonding is used, the light emitting device package 1 may have relatively excellent heat dissipation efficiency, as compared to wire bonding. Alternatively, the use of flip-chip bonding may involve a change of design of the package substrate 4 when specifications of a device to which the light emitting device package 1 is to be applied are changed.

According to an example embodiment, the package substrate 4 may be provided. The package substrate 4 may allow the light emitting devices 2 to be mounted by flip-chip bonding while changing a serial/parallel connection between the light emitting devices 2, in response to a change in the specifications of the device to which the light emitting device package 1 may be applied. Referring to FIGS. 2 through 13, a light emitting device package and a package substrate that may be applied thereto according to an example embodiment will hereinafter be described.

Figure 2:
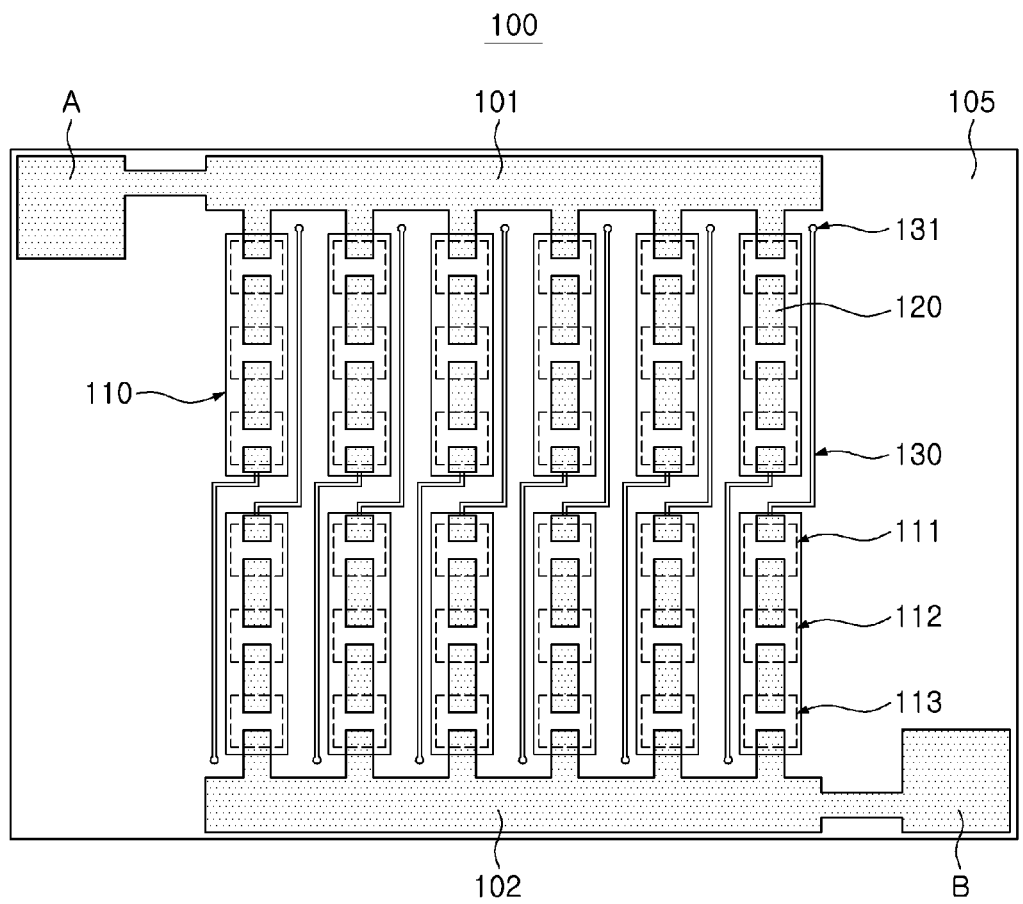
FIG. 2 is a plan view illustrating a package substrate according to an example embodiment.

FIG. 2 is a plan view illustrating a package substrate according to an example embodiment.

Referring to FIG. 2, a package substrate 100 according to an example embodiment may include a base substrate 105, a plurality of unit light emitting regions 110 provided on a surface of the base substrate 105, a plurality of first circuit patterns 120, a plurality of second circuit patterns 130, or the like. A first power pad A and a second power pad B connected to an external power supply module to receive a power supply voltage, power patterns 101 and 102 sending the power supply voltage supplied to the first and second power pads A and B to the first and second circuit patterns 120 and 130, or the like, may be provided on a surface of the base substrate 105. According to an example embodiment, a driving voltage may be supplied through the first power pad A, and a ground voltage may be supplied through the second power pad B.

Each of the plurality of unit light emitting regions 110 may include a plurality of mounting regions 111, 112, and 113. According to the example embodiment illustrated in FIG. 2, the mounting regions 111, 112, and 113 may be regions each having portions of the first circuit patterns 120 separated from each other. The portions of the first circuit patterns 120 disposed in the mounting regions 111, 112, and 113 may be connected to electrodes of light emitting devices provided in the mounting regions 111, 112, and 113. According to an example embodiment, the first circuit patterns 120 may be connected to the electrodes of the light emitting devices in the mounting regions 111, 112, and 113 by flip-chip bonding using a solder bump, or the like. At least a portion of the first circuit patterns 120 may be connected to the power patterns 101 and 102.

The number of light emitting devices included in each of the unit light emitting regions 110 may be defined by the number of the mounting regions 111, 112, and 113 included in each of the plurality of unit light emitting regions 110. A single light emitting device may be disposed in a single mounting region 111, 112, or 113. Thus, three light emitting devices may be disposed in each of the unit light emitting regions 110 in the package substrate 100 according to the example embodiment illustrated in FIG. 2. Here, the plurality of unit light emitting regions 110 are illustrated as having an identical shape to each other and having the identical number of mounting regions 111, 112, and 113 to each other, but is not limited thereto.

At least a portion of the second circuit patterns 130 may be disposed between the unit light emitting regions 110. The second circuit patterns 130 may have a width relatively narrower than those of the first circuit patterns 120. At least a portion of the second circuit patterns 130 may extend to have a length greater than a width of the mounting regions 111, 112, and 113 in a space between the unit light emitting regions 110. Similar to the first circuit patterns 120, the second circuit patterns 130 may be formed of a conductive material, such as a metal, or the like.

Each of the second circuit patterns 130 may have a pad 131 for selective connection (referred to as a "bonding pad") provided at an end thereof. According to the example embodiment illustrated in FIG. 2, the bonding pad 131 is provided at the end of each of the second circuit patterns 130, but an additional bonding pad 131 may be formed in a region other than the end of each of the second circuit patterns 130. The bonding pad 131 may be coupled to a wire added by a process of manufacturing a light emitting device package, and the second circuit patterns 130 may be electrically connected to the first circuit patterns 120 or other second circuit patterns 130 by the wire connected to the bonding pad 131.

The package substrate 100 according to the example embodiment of FIG. 2 may have an additional wire connected thereto by the process of manufacturing a light emitting device package. A plurality of light emitting devices may be disposed in the mounting regions 111, 112, and 113 of the package substrate 100 according to the example embodiment illustrated in FIG. 2, and at least portions of the first and second circuit patterns 120 and 130 may be connected to each other using the wire, so that a light emitting device package may be implemented. Connection structures for light emitting devices will be described with reference to FIGS. 3 and 4.

Figure 3:
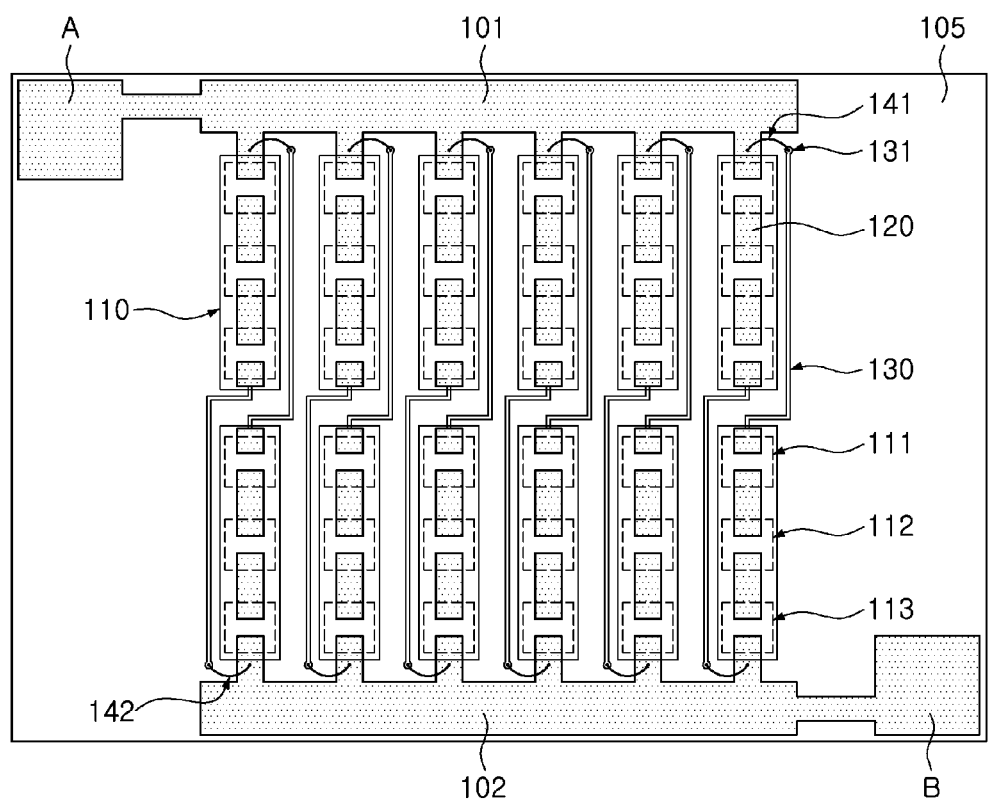
FIGS. 3 and 4 are views illustrating connection structures for light emitting devices that may be implemented with the package substrate according to the example embodiment illustrated in FIG. 2.
Figure 4:
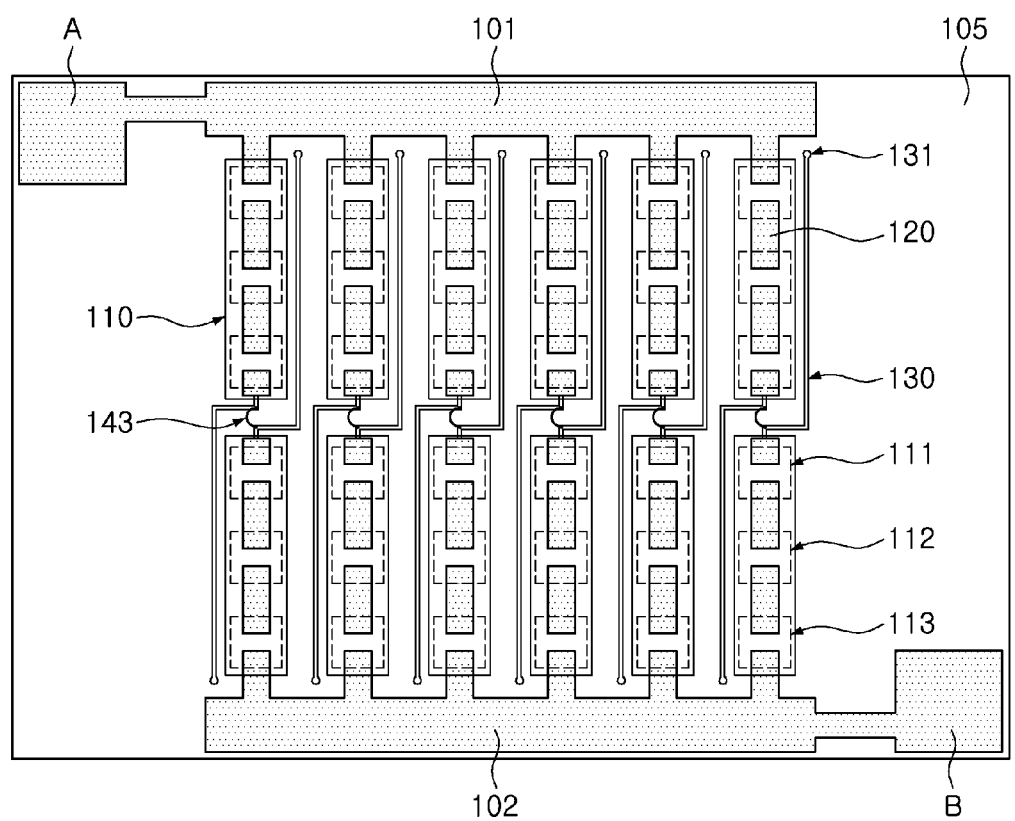

FIGS. 3 and 4 are views illustrating the connection structure for light emitting devices that may be implemented with the package substrate according to the example embodiment illustrated in FIG. 2.

Referring to FIG. 3, by a plurality of wires 141 and 142, the second circuit patterns 130 may be connected to the first circuit patterns 120. The wires 141 and 142 may extend from bonding pads 131 formed at one ends of the second circuit patterns 130 and may be connected to the first circuit patterns 120 directly connected to power lines 101 and 102. The wires 141 and 142 may be linear structures having conductivity, and may be formed as a chip resistor or a circuit pattern other than a common wire formed of copper (Cu), or the like.

For example, if a driving voltage is supplied through a first power pad A and a ground voltage is supplied through a second power pad B, a plurality of unit light emitting regions 110 may be connected to each other in parallel according to the example embodiment illustrated in FIG. 3. Three mounting regions 111, 112, and 113 may be provided in a single unit light emitting region 110, and each of the mounting regions 111, 112, and 113 may have a single light emitting device mounted thereon. Thus, according to a package substrate 100A illustrated in FIG. 3, a circuit structure, in which a plurality of light emitting device strings each having three light emitting devices connected to each other in series may be connected to each other in parallel, may be provided. Connection structures for light emitting devices will be described with reference to FIG. 5.

Figure 5:
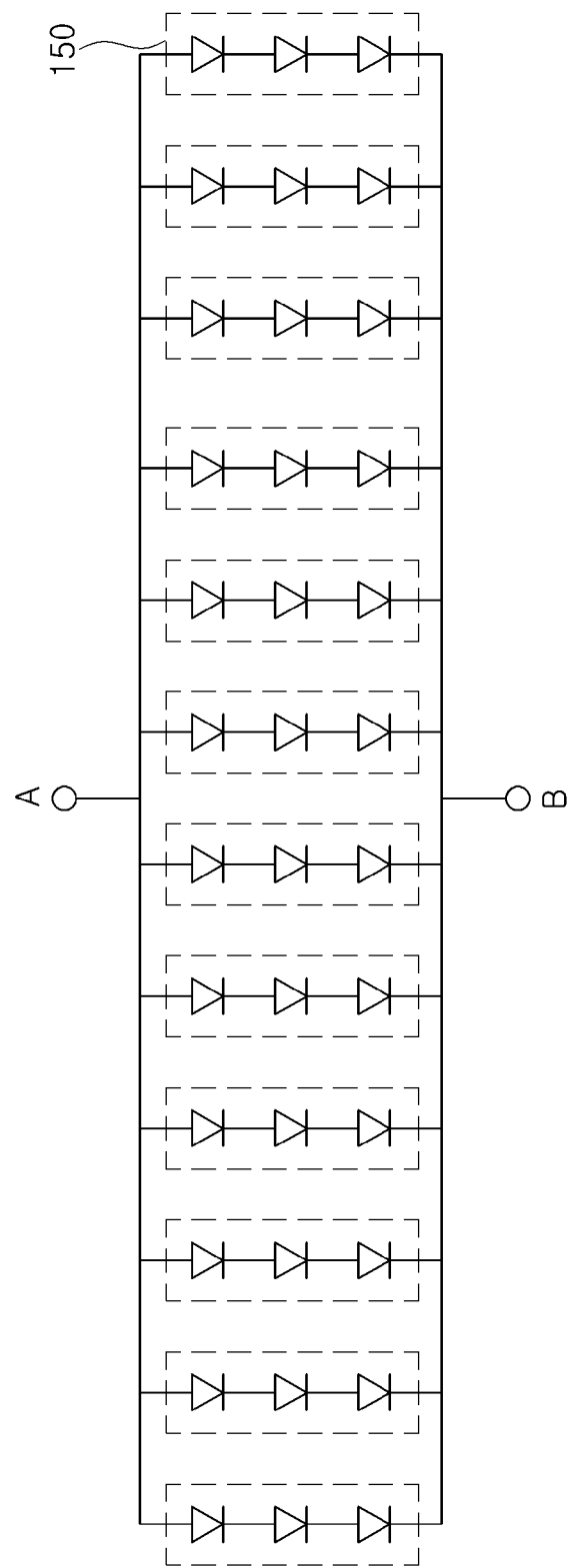
FIGS. 5 and 6 are circuit diagrams illustrating connection structures for light emitting devices that may be implemented with the package substrate illustrated in FIGS. 3 and 4, respectively.

FIG. 5 is a circuit diagram illustrating the connection structure for light emitting devices that may be implemented with the package substrate illustrated in FIG. 3.

Referring to FIG. 5, twelve light emitting device strings 150 each having three light emitting devices connected to each other in series may be connected to each other in parallel between the first and second power pads A and B. Referring back to FIG. 3, the package substrate 100A may include a total of twelve unit light emitting regions 110 including six upper unit light emitting regions and six lower unit light emitting regions, and each of the unit light emitting regions 110 may include three mounting regions 111, 112, and 113 connected to each other in series. For example, a single unit light emitting region 110 may correspond to a single light emitting device string 150 illustrated in FIG. 5.

According to the second circuit patterns 130 and the wires 141 and 142 formed on the package substrate 100A illustrated in FIG. 3, the respective unit light emitting regions 110 may be connected to each other in parallel. Thus, when light emitting devices are connected to the mounting regions 111, 112, and 113 included in the package substrate 100A, a light emitting device package in which twelve light emitting device strings 150 each having three light emitting devices connected to each other in series as illustrated in FIG. 5 may be connected to each other in parallel, may be provided.

In FIG. 4, a package substrate 100B according to the example embodiment may include a wire 143 of which connection type is different from that of the package substrate 100A in FIG. 3. Referring to FIG. 4, the wire 143 may electrically connect the second circuit patterns 130 to each other between the plurality of unit light emitting regions 110. In this case, the respective second circuit patterns 130 connected to each other by a single wire 143 may be connected to different unit light emitting regions 110.

The unit light emitting regions 110 connected by the wire 143 may be connected to each other in series. Thus, a light emitting device package provided by the package substrate 100B illustrated in FIG. 4 may have a connection structure different from that of the light emitting device package provided by the package substrate 100A illustrated in FIG. 3. Connection structures for light emitting devices will be described with reference to FIG. 6.

Figure 6:
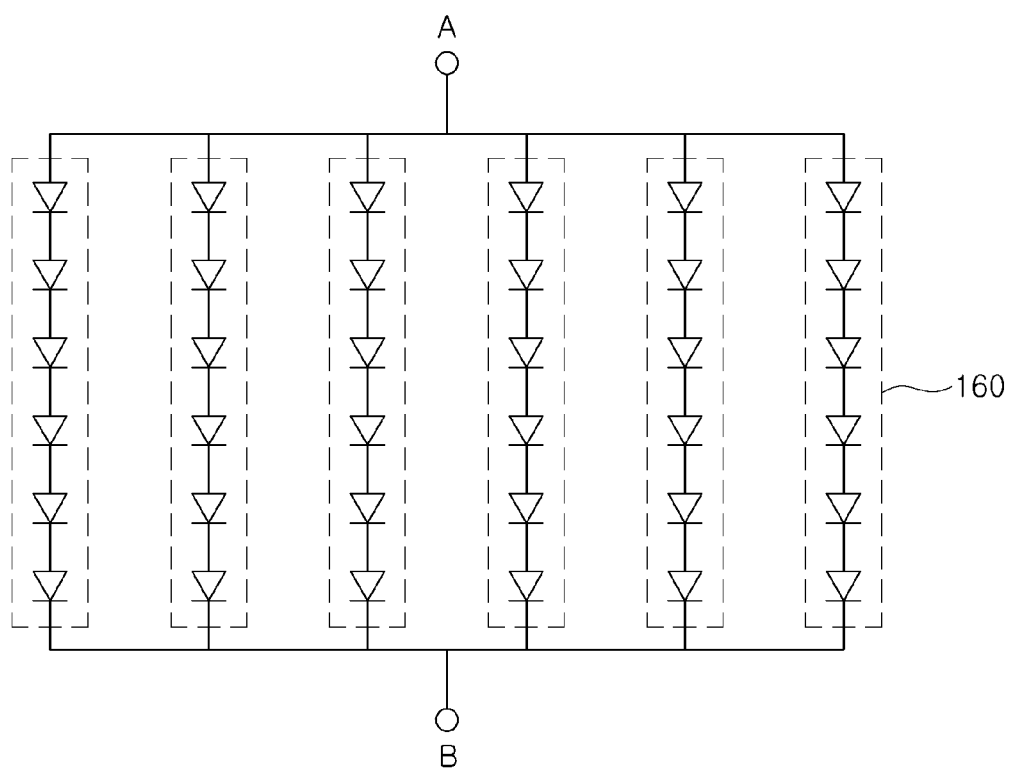

FIG. 6 is a circuit diagram illustrating the connection structure for light emitting devices that may be implemented with the package substrate illustrated in FIG. 4.

Referring to FIG. 6, a single light emitting device string 160 may include six light emitting devices connected to each other in series, and a total of six light emitting device strings 160 may be connected to each other in parallel. The light emitting device strings 160 may receive driving voltages through the first and second power pads A and B to operate.

In the package substrate 100A according to the example embodiment illustrated in FIG. 3, a current supplied through the first power pad A may be sent to the second power pad B through the unit light emitting regions 110, the second circuit patterns 130, and the wire 142, or through the wire 141, the second circuit patterns 130, and the unit light emitting regions 110. In the package substrate 100B according to the example embodiment illustrated in FIG. 4, a current supplied through the first power pad A may be sent to the second power pad B through the unit light emitting regions 110, the wire 142, and the unit light emitting regions 110. Thus, as described above, in the package substrate 100B according to the example embodiment illustrated in FIG. 4, two unit light emitting regions 110 may be connected to each other in series by the wire 143.

As illustrated in the circuit diagram of FIG. 6, a single light emitting device string 160 may include six light emitting devices connected to each other in series. Thus, the package substrate 100B illustrated in FIG. 4 may be applied to a light emitting device package that may operate with a higher level of driving voltage than that applied to the package substrate 100A illustrated in FIG. 3. Alternatively, when a voltage difference between the first and second power pads A and B is equal to that between the first and second power pads A and B of FIG. 3, a forward voltage applied to the individual light emitting devices mounted on the package substrate 100A illustrated in FIG. 3 may be higher than that applied to the individual light emitting devices mounted on the package substrate 100B illustrated in FIG. 4.

Figure 7:
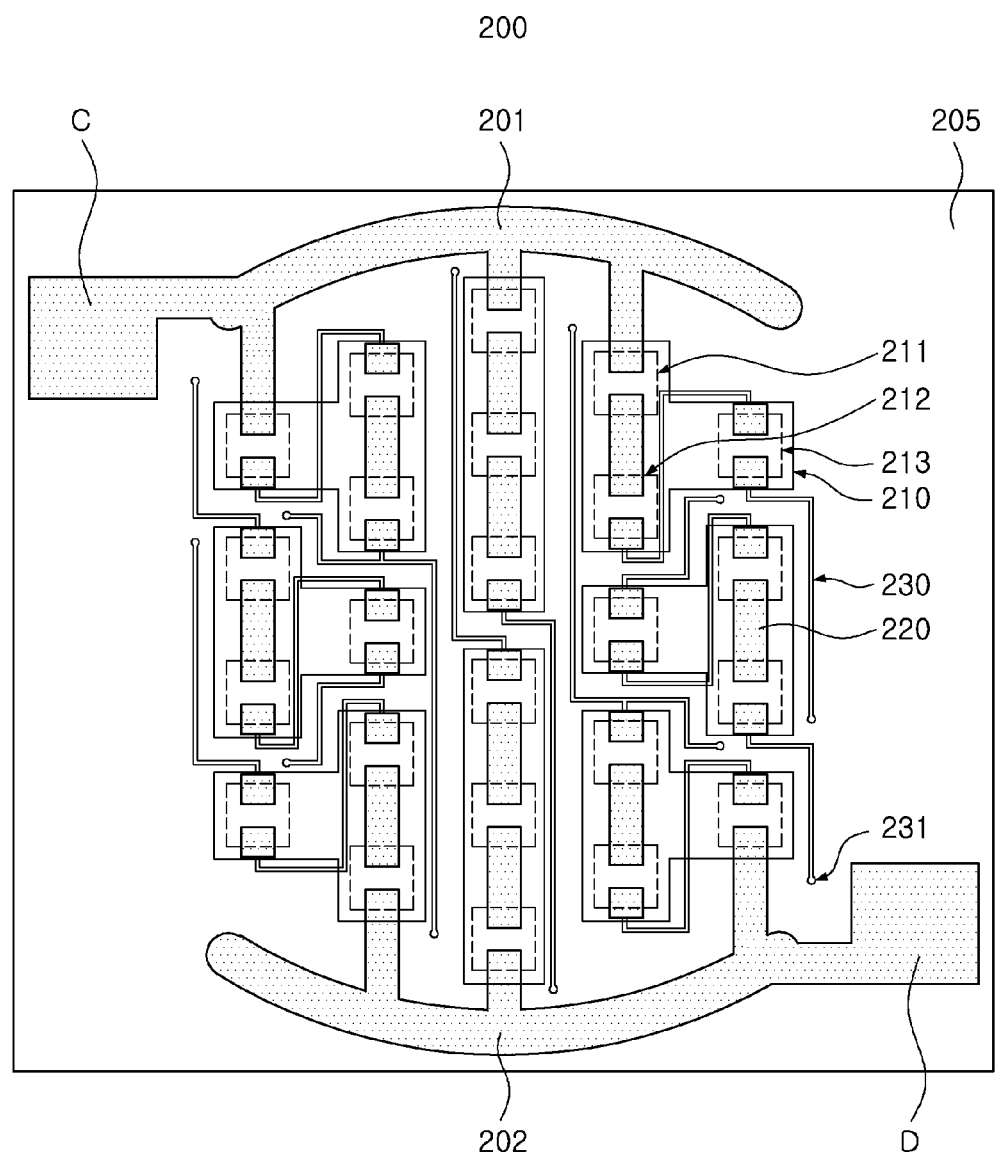
FIG. 7 is a plan view illustrating a package substrate according to an example embodiment.

FIG. 7 is a plan view illustrating a package substrate according to an example embodiment.

Referring to FIG. 7, a package substrate 200 according to an example embodiment may include a first power pad C, a second power pad D, a power line 201, and a power line 202 receiving a power supply voltage, a plurality of unit light emitting regions 210, a plurality of first circuit patterns 220, a plurality of second circuit patterns 230, or the like. Each of the plurality of unit light emitting regions 210 may include a plurality of mounting regions 211, 212, and 213. According to the example embodiment illustrated in FIG. 7, a single unit light emitting region 210 is illustrated as having three mounting regions 211, 212, and 213, but is not limited thereto.

According to the example embodiment illustrated in FIG. 7, at least a portion of the unit light emitting regions 210 may have different shapes. Referring to FIG. 7, a unit light emitting region 210 positioned in a center thereof may have a rectangular shape in which three mounting regions 211, 212, and 213 may be connected to each other in a vertical direction, while other unit light emitting regions 210 may have shapes different from the rectangular shape. In particular, at least portions of three mounting regions 211, 212, and 213 included in a portion of the unit light emitting regions 210 may be electrically connected to each other by the second circuit patterns 230 rather than by the first circuit patterns 220.

The second circuit patterns 230 may connect the mounting regions 211, 212, and 213 to each other, or may connect the unit light emitting regions 210 to each other. The second circuit patterns 230 may be narrower than the first circuit patterns 220. In addition, as illustrated in FIG. 7, at least a portion of the second circuit patterns 230 may be disposed between the unit light emitting regions 210 to extend to have a length greater than a width of the mounting regions 211, 212, and 213.

Similar to the package substrate 100 illustrated in FIG. 3, the mounting regions 211, 212, and 213 according to the example embodiment illustrated in FIG. 7 may be defined as regions having portions of the first circuit patterns 220 separated from each other. The first circuit patterns 220 within the mounting regions 211, 212, and 213 may be electrically connected to light emitting devices. As an example, electrodes of the light emitting devices may be connected to the first circuit patterns 220 by flip-chip bonding. In addition, at least a portion of the first circuit patterns 220 forming the mounting regions 211, 212, and 213 may be connected to the power lines 201 and 202.

At least a portion of the second circuit patterns 230 may be disposed between the unit light emitting regions 210, or within portions of the unit light emitting regions 210. Each of the second circuit patterns 230 disposed between the unit light emitting regions 210 may include a bonding pad 231, and a wire may be connected to the bonding pad 231, so that the second circuit patterns 230 may be electrically connected to other second circuit patterns 230 or the first circuit patterns 220. According to a position, number, or the like, of the wires, a serial/parallel connection structure for light emitting devices may be determined in a light emitting device package to which the package substrate 200 may be applied. For example, various specifications of light emitting device packages may be provided without a change of design of the package substrate 200 by changing the position and number of the wires. Connection structures for light emitting devices will be described with reference to FIGS. 8 through 10.

Figure 8:
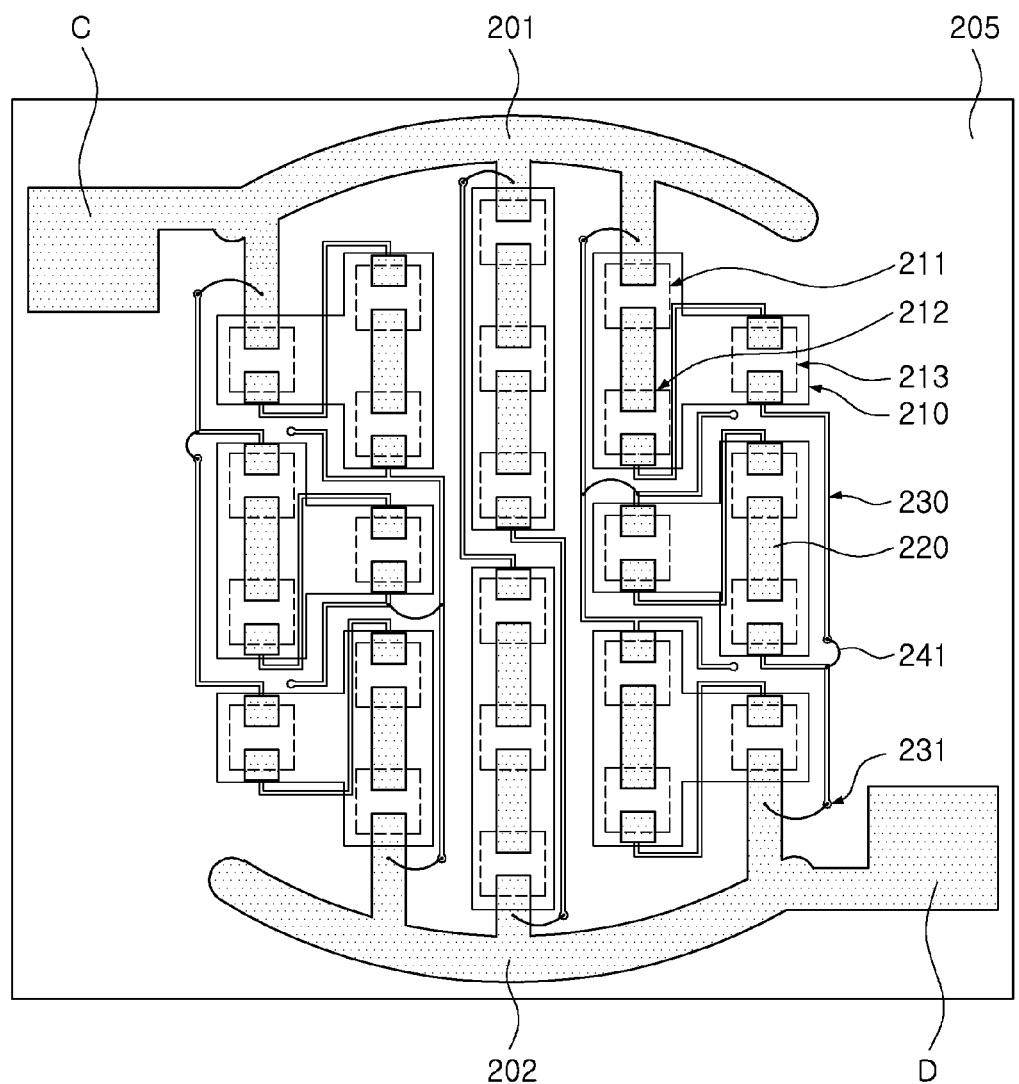
FIGS. 8, 9, and 10 are views illustrating connection structures for light emitting devices that may be implemented with the package substrate according to the example embodiment illustrated in FIG. 7.
Figure 9:
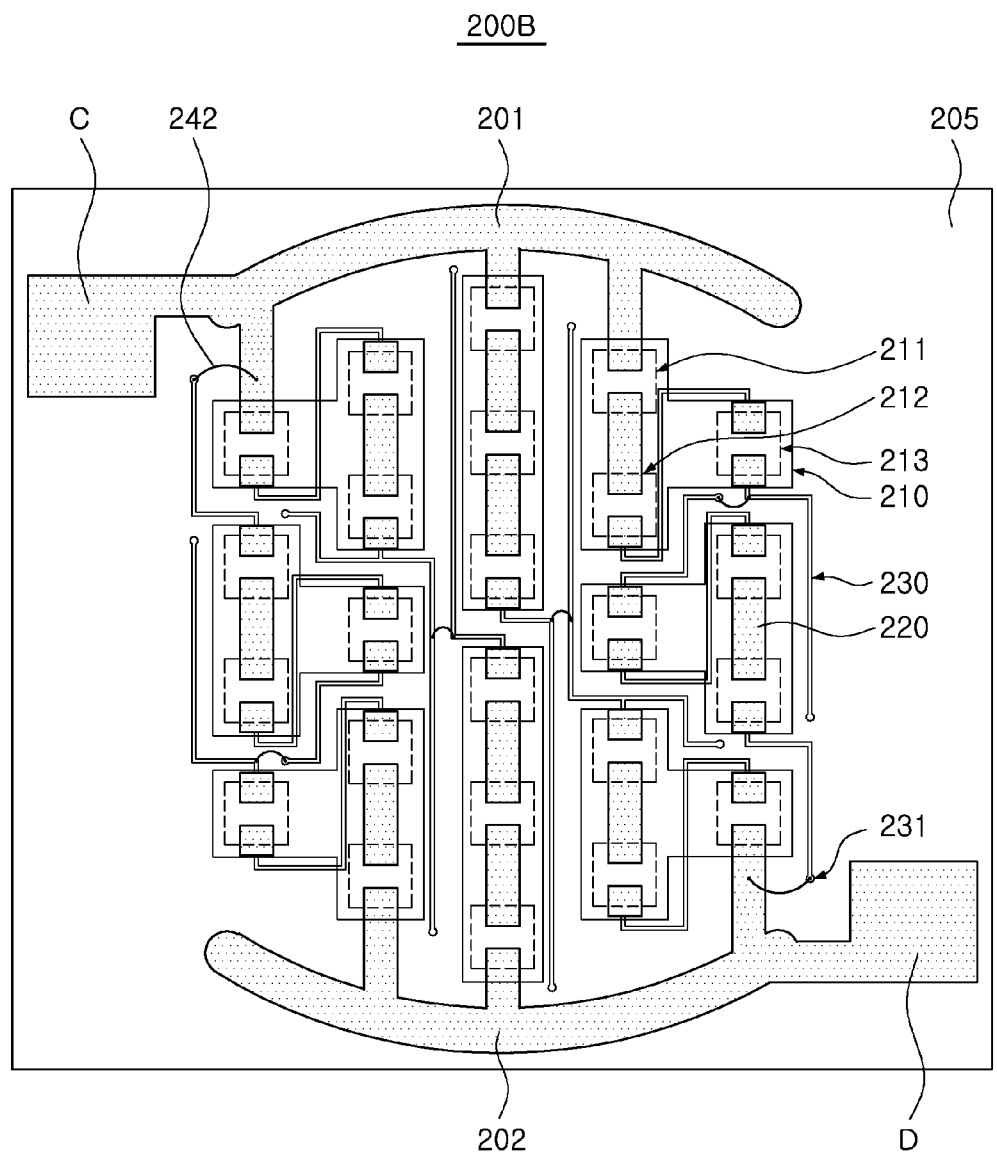
Figure 10:
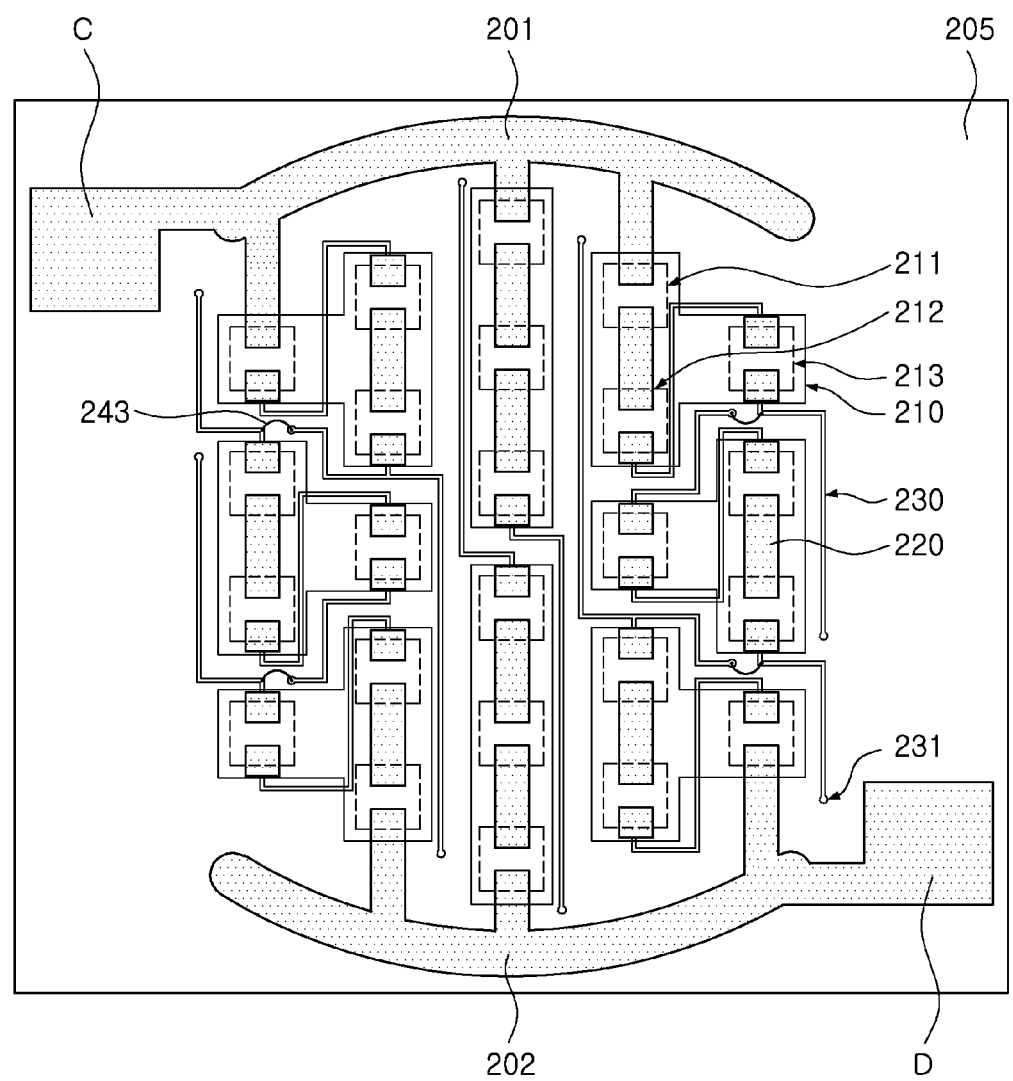

FIGS. 8 through 10 are views illustrating the connection structure for light emitting devices that may be implemented with the package substrate according to the example embodiment illustrated in FIG. 7.

Figure 11:
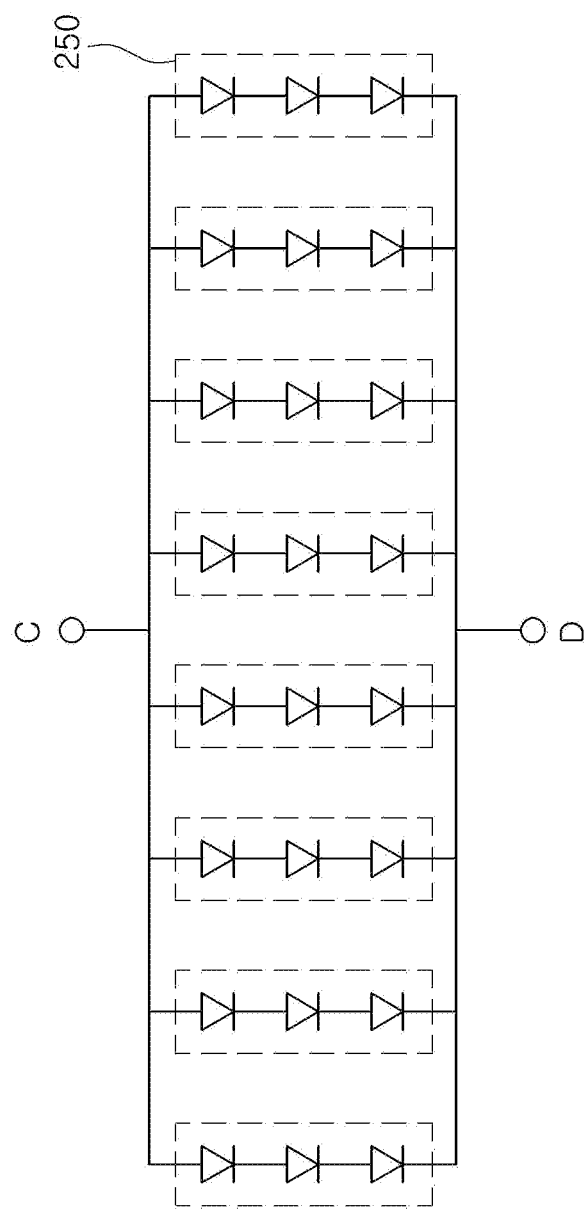
FIGS. 11, 12, and 13 are circuit diagrams illustrating connection structures for light emitting devices that may be implemented with the package substrate illustrated in FIGS. 8, 9, and 10, respectively.
Figure 12:
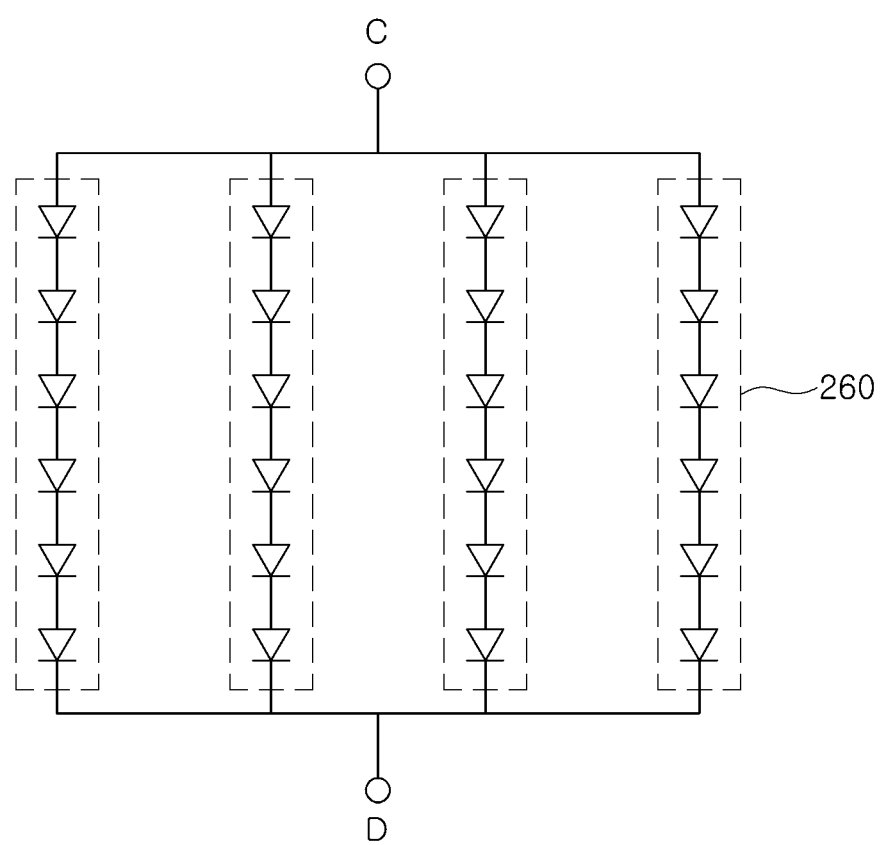

According to the example embodiment illustrated in FIG. 8, by a wire 241, portions of second circuit patterns 230 may be connected to each other, or connected to first circuit patterns 220. According to the example embodiment illustrated in FIG. 8, respective unit light emitting regions 210 each including three mounting regions 211, 212, and 213 may be connected to each other in parallel. Thus, as illustrated in FIG. 11, a light emitting device package having a structure in which eight light emitting device strings 250 may be connected to each other in parallel in a space between the first power pad C and the second power pad D, may be provided.

Referring next to FIG. 9, a wire 242 may be connected to second circuit patterns 230 in a manner different from that of the example embodiment illustrated in FIG. 8. According to the example embodiment illustrated in FIG. 9, in a unit light emitting region 210 disposed closest to the first power pad C, a current supplied through the first power pad C may flow to the second power pad D sequentially through unit light emitting regions 210, the second circuit patterns 230, the wire 242, and the unit light emitting regions 210. The current supplied through the first power pad C may also flow to the second power pad D through the wire 242, the second circuit patterns 230, the unit light emitting regions 210, the second circuit patterns 230, the wire 242, and the unit light emitting regions 210.

As illustrated in FIG. 9, two unit light emitting regions 210 may be connected to each other in series in a space between the first and second power pads C and D by disposing the wire 242. Thus, a package substrate 200B according to the example embodiment illustrated in FIG. 9 may be applied to a light emitting device package having a connection structure illustrated in FIG. 12. For example, the package substrate 200B may be applied to the light emitting device package having the connection structure in which four light emitting device strings 260 each having six light emitting devices connected to each other in series may be connected to each other in parallel.

In FIG. 10, a package substrate 200C according to the example embodiment may include a wire 243 disposed in a position different from those of the wires 241 and 242 according to the example embodiments illustrated in FIGS. 8 and 9. Referring to FIG. 10, a current supplied through a first power pad C may flow to a second power pad D through unit light emitting regions 210, second circuit patterns 230, the wire 243, the unit light emitting regions 210, the second circuit patterns 230, the wire 243, and the unit light emitting regions 210. For example, three unit light emitting regions 210 may be connected to each other in series in a space between first and second power pads C and D.

Figure 13:
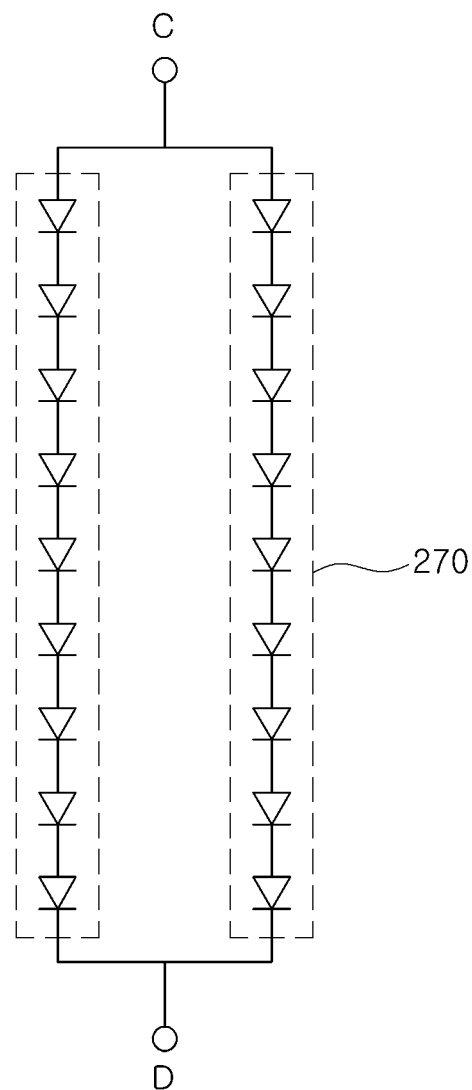

Thus, the package substrate 200C according to the example embodiment illustrated in FIG. 10 may be applied to a light emitting device package having a connection structure illustrated in FIG. 13. A light emitting device package including the package substrate 200C according to the example embodiment illustrated in FIG. 10 may include light emitting device strings 270 each having nine light emitting devices connected to each other in series.

As described above, the package substrates 200A, 200B, and 200C having different connection structures may be provided by changing the positions and numbers of the wires 241, 242, and 243 on a single package substrate 200. Thus, light emitting device packages having different specifications may be manufactured without a redesign of the package substrate 200 by changing the positions, numbers, or the like, of the wires 241, 242, and 243 in a process of manufacturing a light emitting device package.

The package substrates 200A, 200B, and 200C illustrated in FIGS. 8 through 10 may be applied to a light emitting device package that may operate with different levels of driving voltages. When levels of forward voltages applied to light emitting devices mounted on the package substrates 200A, 200B, and 200C illustrated in FIGS. 8 through 10 are equal to each other, the package substrate 200C illustrated in FIG. 10 may be applied to a light emitting device package that may receive a highest level of driving voltage.

When levels of voltages between the first and second power pads C and D are equal to each other, the numbers, positions, or the like, of the wires 241, 242, and 243 may be determined depending on forward voltages applied to the light emitting devices mounted on the package substrates 200A, 200B, and 200C. As an example, when a high-output light emitting device having a relatively high level of forward voltage is desired to be applied, the package substrate 200A or 200B according to the example embodiment illustrated in FIG. 8 or 9 may be used. In contrast, when a light emitting device having a relatively low level of forward voltage is desired to be applied, the package substrate 200C according to the example embodiment illustrated in FIG. 10 may be used.

The wires 241, 242, and 243 included in the package substrates 200A, 200B, and 200C may have lengths shorter than those of the first and second circuit patterns 220 and 230, and in particular, may not overlap the unit light emitting regions 210 in order not to reduce luminous efficiency. The wires 241, 242, and 243 may be provided before or after light emitting devices are disposed in the mounting regions 211, 212, and 213. Each of the wires 241, 242, and 243 may be formed of a conductive line on a surface of the base substrate 205, or may also be substituted with a passive element, such as a resistor element, or the like, if necessary.

FIGS. 14, 15, 16, 17, and 18 are views illustrating light emitting devices which may be applied to a light emitting device package according to an example embodiment.

Figure 14:
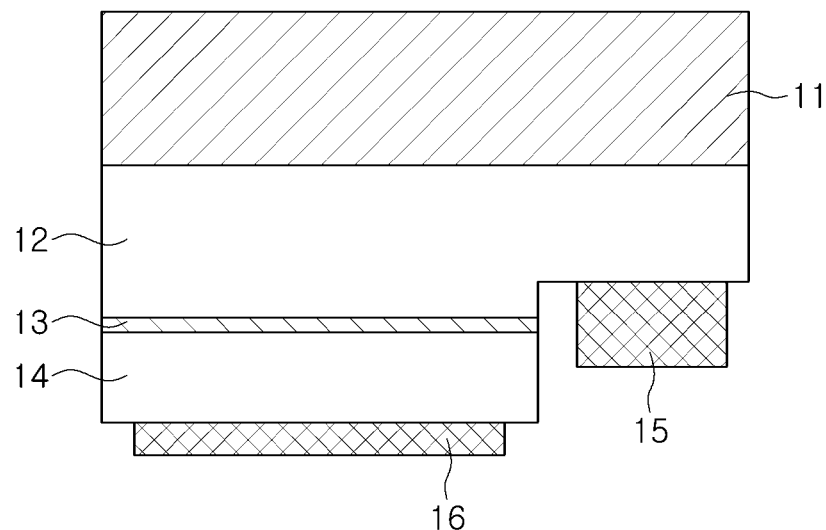
FIGS. 14, 15, 16, 17, and 18 are views illustrating light emitting devices which may be applied to a light emitting device package according to an example embodiment.

Referring to FIG. 14, a light emitting device 10 according to an example embodiment may include a support substrate 11, a first conductive semiconductor layer 12, an active layer 13, a second conductive semiconductor layer 14, a first electrode 15, and a second electrode 16. The light emitting device 10 according to the example embodiment illustrated in FIG. 14 may be bonded to each of the package substrates 100A, 100B, 200A, 200B, and 200C according to an example embodiment by flip-chip bonding. Since light generated by the active layer 13 needs to be transmitted to an upper portion thereof, the support substrate 11 may be formed of a material having light transmittance.

The first conductive semiconductor layer 12 and the second conductive semiconductor layer 14 included in the light emitting device 10 may be an n-type semiconductor layer and a p-type semiconductor layer, respectively. For example, each of the first and second conductive semiconductor layers 12 and 14 may include a group III nitride semiconductor layer, such as a material having a composition of $Al_xIn_yGa_{1-x-y}N$ ($0 \leq x \leq 1$, $0 \leq y \leq 1$, $0 \leq x+y \leq 1$), but is not limited thereto, and may also include a material, such as an AlGaInP-based semiconductor or an AlGaAs-based semiconductor.

To reflect light traveling downwardly from the active layer 13, the second electrode 16 may be formed of a material having excellent electrical conductivity and reflectivity. For example, the second electrode 16 may be formed of at least one of silver (Ag), nickel (Ni), aluminum (Al), rhodium (Rh), palladium (Pd), iridium (Ir), ruthenium (Ru), magnesium (Mg), zinc (Zn), platinum (Pt), or gold (Au).

Figure 15:
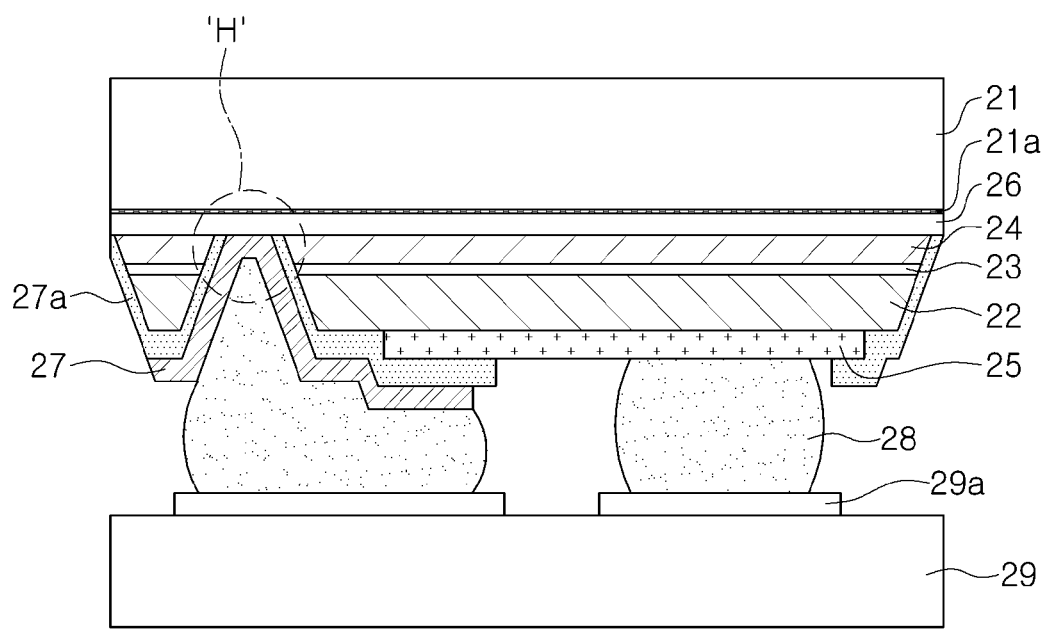

Referring to FIG. 15, a light emitting device 20 according to an example embodiment may include a first conductive semiconductor layer 22, a second conductive semiconductor layer 24, an active layer 23 positioned therebetween, and a first electrode 25 and a second electrode respectively connected to the first conductive semiconductor layer 22 and the second conductive semiconductor layer 24. According to the example embodiment of FIG. 15, the first and second electrodes 25 and 26 may be disposed on opposite surfaces of the first and second conductive semiconductor layers 22 and 24 with the first conductive semiconductor layer 22, the active layer 23, and the second conductive semiconductor layer 24 interposed therebetween. The second electrode 26 may have a support substrate 21 bonded thereto by a bonding layer 21a to support the light emitting device 20.

The light emitting device 20 according to the example embodiment of FIG. 15 may include an additional connecting electrode 27 as an electrode element related to the second electrode 26. The connecting electrode 27 may be connected to the second electrode 26 by a through hole H formed by removing at least regions of the first and second conductive semiconductor layers 22 and 24 and the active layer 13. By the through hole H, at least a region of the second electrode 26 may be exposed, and the second electrode 26 and the connecting electrode 27 may be connected to each other in the exposed region. The connecting electrode 27 may be formed along the side walls of the through hole H. An insulating layer 27a may be provided in a space between the connecting electrode 27 and the side walls of the through hole H to prevent the connecting electrode 27, the active layer 23, and the first conductive semiconductor layer 22 from being electrically connected to each other.

The above described electrode structure may be applied more efficiently when the first and second conductive semiconductor layers 22 and 24 are n- and p-type nitride semiconductor layers, respectively. The p-type nitride semiconductor layer may have a level of contact resistance higher than that of the n-type nitride semiconductor layer, and it may be difficult to obtain an ohmic contact. However, according to the example embodiment illustrated in FIG. 15, the second electrode 26 may be disposed over the entire surface of the support substrate 21 to secure a sufficient contact area between the second conductive semiconductor layer and the second electrode 26, thus obtaining an ohmic contact with the p-type nitride semiconductor layer.

The light emitting device 20 according to the example embodiment illustrated in FIG. 15 may have a flip-chip structure in which light may be emitted in a direction of the support substrate 21. For example, the first electrode 25 and the connecting electrode 27 may be electrically connected to a circuit pattern 29a of a package substrate 29 through a solder bump, or the like. The circuit pattern 29a may correspond to the first circuit patterns 120 illustrated in FIG. 2, 7, or the like.

The first electrode 25 may include an electrode material having high reflectivity, as well as ohmic contact characteristics. The second electrode 26 and the support substrate 21 may have a high degree of light transmittance. For example, the first electrode 25 may include a material, such as silver (Ag), nickel (Ni), aluminum (Al), rhodium (Rh), palladium (Pd), iridium (Ir), ruthenium (Ru), magnesium (Mg), zinc (Zn), platinum (Pt), or gold (Au). The second electrode may include a light transmitting metal, such as nickel (Ni)/gold (Au), or a transparent conductive oxide or nitride, such as an indium tin oxide (ITO). The support substrate 21 may include a glass substrate, or a substrate formed of a light transmitting polymer resin.

The connecting electrode 27 may be electrically insulated from the first conductive semiconductor layer 22 and the active layer 23 by the insulating layer 27a. As illustrated in FIG. 15, the insulating layer 27a may be formed along the side walls of the through hole H. The insulating layer 27a may also be formed on side surfaces of the first and second conductive semiconductor layers 22 and 24 and the active layer 23 as a passivation layer for the light emitting device 20. The insulating layer 27a may include a silicon oxide or a silicon nitride.

Figure 16:
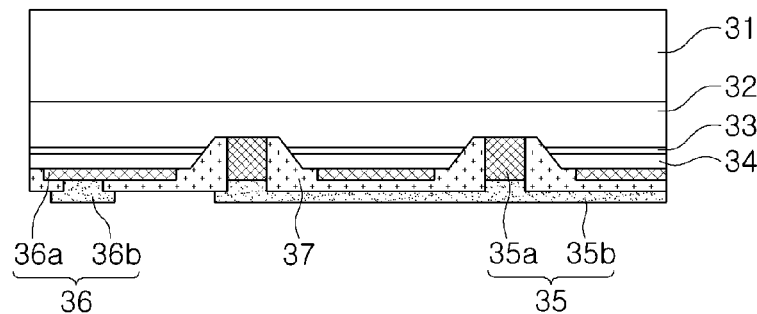

Referring next to FIG. 16, a light emitting device 30 according to an example embodiment is disclosed. The light emitting device 30 may include a first conductive semiconductor layer 32, an active layer 33, and a second conductive semiconductor layer 34 sequentially stacked on a surface of a substrate 31, a first electrode 35, and a second electrode 36. The light emitting device 30 may further include insulators 37. The first and second electrodes 35 and 36 may include first and second contact electrodes 35a and 36a and first and second connecting electrodes 35b and 36b, respectively, and regions of the contact electrodes 35a and 36a exposed by the insulators 37 may be connected to the first and second connecting electrodes 35b and 36b.

The first contact electrode 35a may be provided as a conductive via passing through the second conductive semiconductor layer 34 and the active layer 33 to be connected to the first conductive semiconductor layer 32. The second contact electrode 36a may be connected to the second conductive semiconductor layer 34. The conductive via may be provided as a plurality of conductive vias in a single light emitting device region.

The first and second contact electrodes 35a and 36a may be formed by depositing conductive ohmic materials on the first and second conductive semiconductor layers 32 and 34. Each of the first and second contact electrodes 35a and 36a may include at least one of silver (Ag), aluminum (Al), nickel (Ni), chromium (Cr), copper (Cu), gold (Au), palladium (Pd), platinum (Pt), tin (Sn), titanium (Ti), tungsten (W), rhodium (Rh), iridium (Ir), ruthenium (Ru), magnesium (Mg), zinc (Zn), or alloys thereof. In addition, the second contact electrode 36a may function to reflect light generated by the active layer 33 to be transmitted to a lower portion of the light emitting device 30.

The insulators 37 may have open regions exposing at least portions of the first and second contact electrodes 35a and 36a, and the first and second connecting electrodes 35b and 36b may be connected to the first and second contact electrodes 35a and 36a, respectively. The insulators 37 may be deposited to have a thickness from 0.01 μm to 3 μm at a temperature of 500° C. or below by an SiO2 or SiN chemical vapor deposition (CVD) process. The first and second electrodes 35 and 36 may be disposed on each of the package substrates 100A, 100B, 200A, 200B, and 200C in a flip-chip form.

The first and second electrodes 35 and 36 may be electrically isolated from each other by the insulators 37. The insulators 37 may be any material having electrically insulating characteristics, but may preferably be a material having low light absorption to prevent light extraction efficiency of the light emitting device 30 from deteriorating. For example, a silicon oxide, such as SiO2 and a silicon nitride, such as SiOxNy or SixNy may be used. If necessary, a light-reflective structure may be formed by dispersing a light-reflective filler in a light transmitting material.

The substrate 31 may have a first surface and a second surface opposing each other, and at least one of the first and second surfaces may have an uneven structure formed thereon. An uneven structure that may be formed on a surface of the substrate 31 may be formed by etching a portion of the substrate 31, and may include the same material as that of the substrate 31, or may include a heterogeneous material different from that of the substrate 31. For example, by forming an uneven structure in an interface between the substrate 31 and the first conductive semiconductor layer 32, a path of light emitted by the active layer 33 may be varied, a light absorption rate of a semiconductor layer may be reduced, and a light scattering ratio may be increased, thus increasing light extraction efficiency.

The substrate 31 and the first conductive semiconductor layer 32 may further include a buffer layer disposed therebetween.

Figure 17:
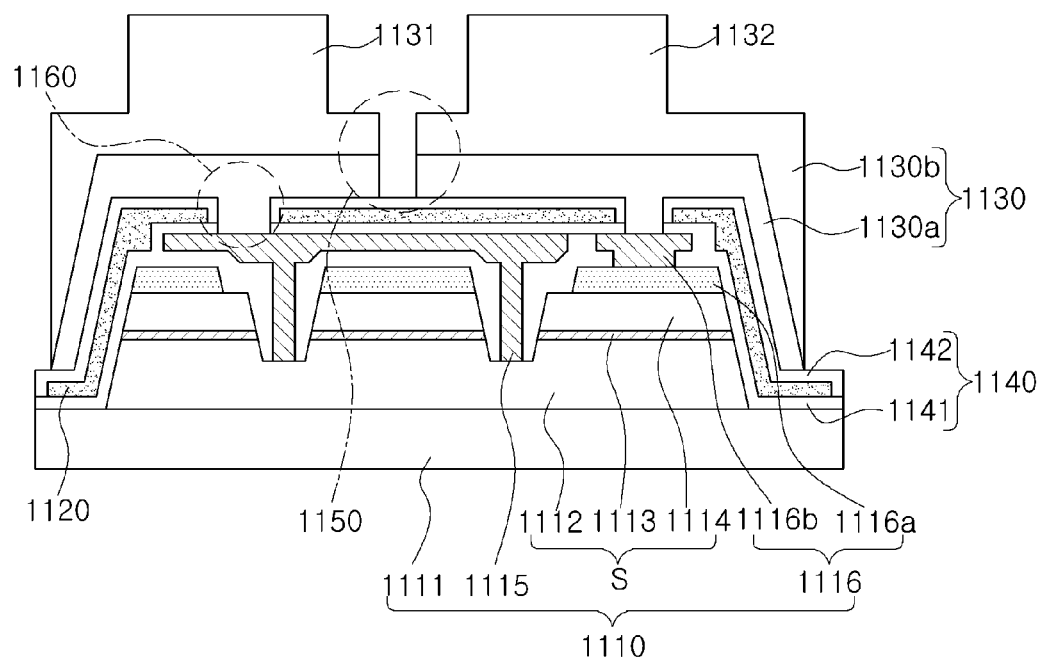

Referring next to FIG. 17, a light emitting device package 1100 according to an example embodiment may include a light emitting device 1110 which includes a substrate 1111, a light emitting structure S provided on the substrate 1111, and a first contact electrode 1115 and a second contact electrode 1116 provided on the light emitting structure S, a reflective metal layer 1120 disposed on the light emitting device 1110, and an electrode metal layer 1130. The light emitting structure S may include a first conductive semiconductor layer 1112, an active layer 1113, and a second conductive semiconductor layer 1114. The first and second contact electrodes 1115 and 1116 may be connected to the first and second conductive semiconductor layer 1112 and 1114, respectively.

According to the example embodiment illustrated in FIG. 17, the second contact electrode 1116 may include a lower second contact electrode 1116a and an upper second contact electrode 1116b, but is not limited thereto. The first contact electrode 1115 may include a single layer. However, similar to the second contact electrode 1116, the first contact electrode 1115 may also include a plurality of layers. The first contact electrode 1115 may be insulated from the active layer 1113 and the second conductive semiconductor layer 1114 by a first insulating layer 1141, and may only be electrically connected to the first conductive semiconductor layer 1112.

The first and second contact electrodes 1115 and 1116 may have a second insulating layer 1142 and a reflective metal layer 1120 provided thereabove. The second insulating layer 1142 may be connected to a first insulating layer 1141 in at least portions thereof to form an insulating layer 1140, and the insulating layer 1140 may allow the reflective metal layer 1120 to be electrically insulated from the first and second contact electrodes 1115 and 1116.

The reflective metal layer 1120 and the insulating layer 1140 may have an electrode metal layer 1130 provided thereon and having a first electrode 1131 and a second electrode 1132. The electrode metal layer 1130 may include a first layer 1130a provided above the reflective metal layer 1120 and a second layer 1130b provided on the first layer 1130a. The electrode metal layer 1130 may be insulated from the reflective metal layer 1120 by the insulating layer 1140. The second layer 1130b may directly contact an upper surface of the first layer 1130a, and may be formed by an electroplating process, or the like, using the first layer 1130a as a seed layer. The electrode metal layer 1130 may be connected to the first circuit patterns 120 of the package substrate 100A or 100B or the first circuit patterns 220 of the package substrate 200A, 200B, or 200C by a solder bump, or the like.

Referring to FIG. 17, the first layer 1130a and the second layer 1130b may be separated from each other in a first region 1150 to form the first electrode 1131 and the second electrode 1132. The first region 1150 may be a region in which the first and second electrodes 1131 and 1132 may be electrically insulated from each other. Meanwhile, the first electrode 1131 may pass through the insulating layer 1140 in a second region 1160 positioned in a lower portion of the first electrode 1131 to be electrically connected to the first contact electrode 1115, and similarly, the second electrode 1132 may pass through the insulating layer 1140 in a second region 1160 positioned in a lower portion of the second electrode 1132 to be electrically connected to the second contact electrode 1116. For example, the first and second electrodes 1131 and 1132 may be connected to the first and second contact electrodes 1115 and 1116 in the plurality of second regions 1160 present in positions different from that of the first region 1150, respectively.

According to the example embodiment illustrated in FIG. 17, the insulating layer 1140 may include the first insulating layer 1141 disposed in a space between the reflective metal layer 1120 and the light emitting device 1110 and the second insulating layer 1142 disposed in a space between the reflective metal layer 1120 and the electrode metal layer 1130. Thus, the reflective metal layer 1120 and the electrode metal layer 1130 may be electrically insulated from each other, and it may not be required to eliminate the reflective metal layer 1120 from below the first region 1150. Therefore, the reflective metal layer 1120 may be selectively removed from the plurality of second regions 1160 having an area relatively smaller than that of the first region 1150, and light extraction efficiency of the light emitting device 1110 may thus be increased. In addition, when the light emitting device 1110 is mounted on each of the package substrates 100A, 100B, 200A, 200B, and 200C, a resin not including a reflective material, an under-fill resin, may be applied so that manufacturing costs may be reduced.

Figure 18:
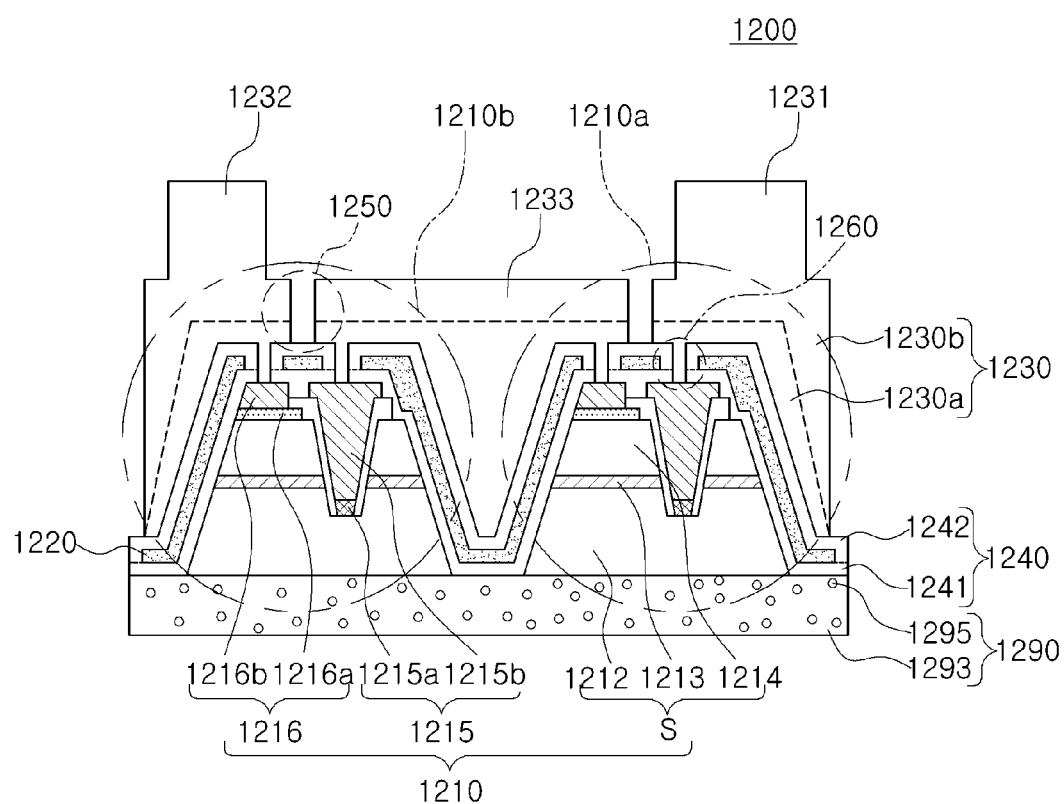

Referring to FIG. 18, a light emitting device package 1200 according to an example embodiment may include a light emitting device 1210 which includes a light emitting structure S and a first contact electrode 1215 and a second contact electrode 1216 provided on the light emitting structure S, a reflective metal layer 1220 and an electrode metal layer 1230 disposed above the light emitting device 1210, and an encapsulant 1290.

A structure of the light emitting device 1210 may be similar to that of the light emitting device 1110 illustrated in FIG. 17. The light emitting structure S may include a first conductive semiconductor layer 1212, an active layer 1213, and a second conductive semiconductor layer 1214, and may be formed in a manner of forming the light emitting structure S on a certain growth substrate and removing the growth substrate therefrom. The encapsulant 1290 may be bonded to a surface of the first conductive semiconductor layer 1212 from which the growth substrate is removed. The encapsulant 1290 may include a resin 1293 having excellent light transmittance and a wavelength conversion material 1295 which converts light, emitted by the light emitting device 1210, into light having a different wavelength.

The light emitting device package 1200 according to the example embodiment illustrated in FIG. 18 may include two light emitting devices 1210a and 1210b connected to each other in series. A second conductive semiconductor layer 1214 of the first light emitting device 1210a and the first conductive semiconductor layer 1212 of the second light emitting device 1210b may be connected to each other by a connecting electrode 1233.

The light emitting device 1210 may have the reflective metal layer 1220 and the electrode metal layer 1230 provided thereabove. The reflective metal layer 1220 and the light emitting device 1210 may have a first insulating layer 1241 provided therebeween, and the reflective metal layer 1220 and the electrode metal layer 1230 may have a second insulating layer 1242 provided therebeween. Thus, the reflective metal layer 1220 may be electrically insulated from the light emitting device 1210 and the electrode metal layer 1230. The reflective metal layer 1220 may include at least one of silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn), or alloys thereof.

The electrode metal layer 1230 may include a first layer 1230a and a second layer 1230b. The first layer 1230a may be formed by a sputtering process, or the like, and may include titanium (Ti) or copper (Cu). The second layer 1230b may be formed by an electroplating process using the first layer 1230a as a seed layer, and may be relatively thicker than the first layer 1230a. As illustrated in FIG. 18, regions of the second layer 1230b may be provided as a first and a second metal post of a first and a second electrode 1231 and 1232, respectively. The electrode metal layer 1230 may be connected to the first circuit patterns 120 of the package substrate 100A or 100B or the first circuit patterns 220 of the package substrate 200A, 200B, or 200C by a solder bump, or the like.

The electrode metal layer 1230 may be selectively removed from first regions 1250 to form the first electrode 1231, the second electrode 1232, and the connecting electrode 1233. The connecting electrode 1233 may connect the first and second light emitting devices 1210a and 1210b, included in the light emitting device package 1200, to each other in series. The first electrode 1231 may be electrically connected to the first conductive semiconductor layer 1212 included in the first light emitting device 1210a, and the second electrode 1232 may be electrically connected to the second conductive semiconductor layer 1214 included in the second light emitting device 1210b. Thus, when an electrical signal is input to the first and second electrodes 1231 and 1232, the first and second light emitting devices 1210a and 1210b may simultaneously operate to emit light. To electrically insulate the first and second electrodes 1231 and 1232 from the connecting electrode 1233, the light emitting device package 1200 may include a plurality of first regions 1250. For example, regions of the electrode metal layer 1230 may be removed from the plurality of first regions 1250 to form the first and second electrodes 1231 and 1232 and the connecting electrode 1233.

Meanwhile, the reflective metal layer 1220 may not be present in a plurality of second regions 1260 different from the plurality of first regions 1250. For example, in the plurality of second regions 1260, the first and second electrodes 1231 and 1232 and the connecting electrode 1233 may pass through the reflective metal layer 1220 to be connected to the first and second contact electrodes 1215 and 1216, respectively. In the case of the first light emitting device 1210a, the reflective metal layer 1220 and an insulating layer 1240 may not be present in the plurality of second regions 1260, and the first electrode 1231 may be electrically connected to a first contact electrode 1215, and the connecting electrode 1233 may be electrically connected to a second contact electrode 1216. In the case of the second light emitting device 1210b, in the plurality of second regions 1260, the connecting electrode 1233 may be electrically connected to the first contact electrode 1215, and the second electrode 1232 may be electrically connected to the second contact electrode 1216.

The plurality of first regions 1250 may be relatively greater than the plurality of second regions 1260. The reflective metal layer 1220 may not be selectively formed only in the plurality of second regions 1260 to secure a greater area of the reflective metal layer 1220, thus increasing light extraction efficiency of the light emitting device package 1200. In addition, when the first regions 1250 are formed by a manufacturing process, only the electrode metal layer 1230 may be removed and the reflective metal layer

1220 may not be eliminated to prevent an under-cut effect that may occur due to excessive etching of the first layer 1230a, thus avoiding a stripping effect of the electrode metal layer 1230.

Figure 19A:
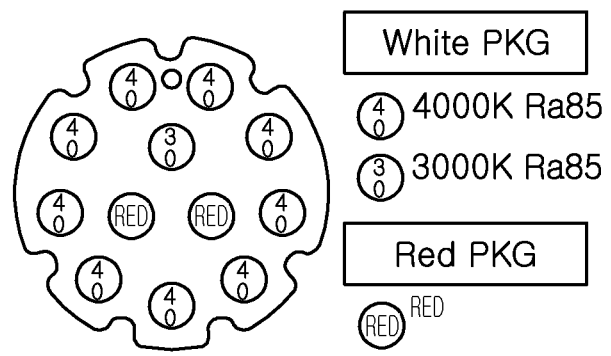
FIGS. 19A and 19B are schematic views illustrating white light source modules that may be implemented with a light emitting device package according to an example embodiment.
Figure 19B:
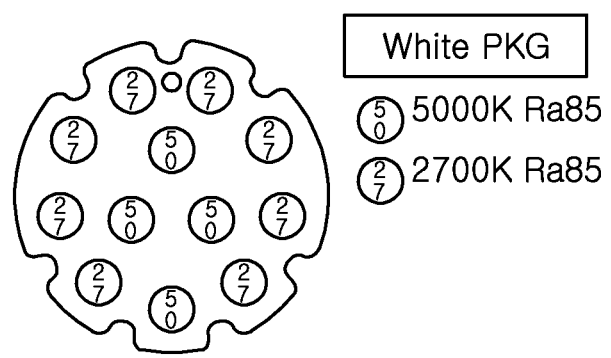
Figure 20:
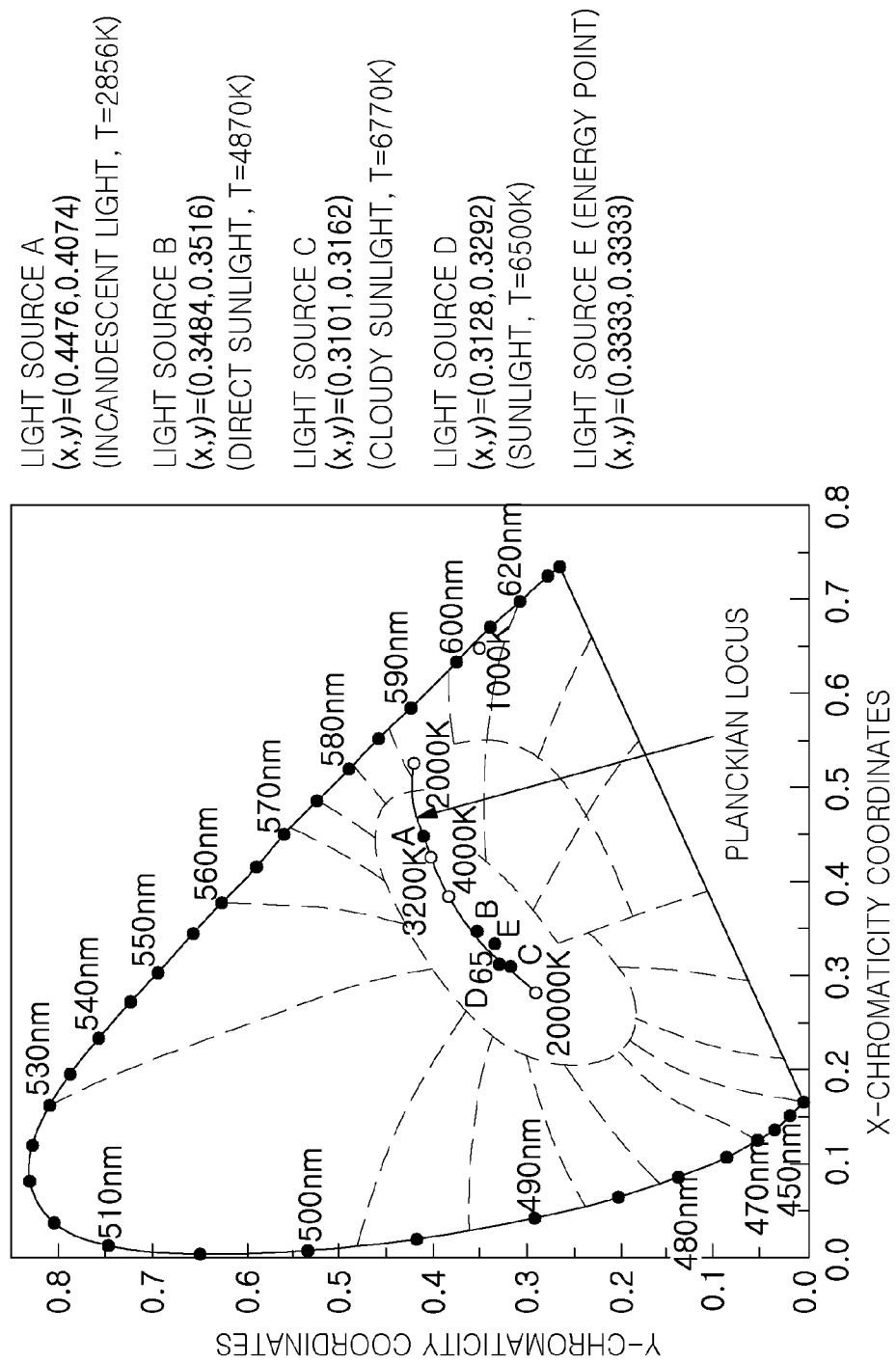
FIG. 20 is a CIE 1931 color space chromaticity diagram illustrating operations of the white light source modules respectively illustrated in FIGS. 19A and 19B.

FIGS. 19A and 19B are schematic views illustrating white light source modules that may be implemented with a light emitting device package according to an example embodiment, respectively. FIG. 20 is a CIE 1931 color space chromaticity diagram illustrating operations of the white light source modules respectively illustrated in FIGS. 19A and 19B.

The white light source modules respectively illustrated in FIGS. 19A and 19B may include a plurality of light emitting device packages mounted on circuit boards. A plurality of light emitting device packages mounted in a single white light source module may include a same kind of package which generates light having an identical wavelength, but as in the example embodiments of FIGS. 19A and 19B, may also include different kinds of packages which generates light having different wavelengths.

Referring to FIG. 19A, the white light source module may be implemented by combining white light emitting device packages 30 and 40 having color temperatures 3,000K and 4,000K, respectively, with a red light emitting device package RED. The white light source module may provide white light having a color temperature from 3,000K to 4,000K and a color rendering index (CRI) from 95 Ra to 100 Ra.

As another example, a white light source module may include only white light emitting device packages, and a portion thereof may emit white light having different color temperatures. For example, as illustrated in FIG. 19B, a combination of a white light emitting device package 27 having a color temperature of 2,200K and a white light emitting device package 50 having a color temperature of 5,000K may allow white light having a color temperature from 2,200K to 5,000K and a CRI from 85 Ra to 99 Ra to be provided. Here, the number of respective light emitting device packages having color temperatures may vary according to default color temperature setting values. For example, if a lighting device has a default color temperature setting value adjacent to 4,000K, the lighting device may include light emitting device packages having a color temperature of 4,000K that are more than light emitting device packages having a color temperature of 3,100K or red light emitting device packages.

As such, different kinds of light emitting device packages may include at least one of a light emitting device, in which a blue light emitting device is combined with a yellow, green, red or orange phosphor to emit white light, or a purple, blue, green, red or infrared light emitting device, thus adjusting a color temperature and a CRI of white light. The abovementioned white light source modules may be employed as light sources for various types of lighting devices.

A single light emitting device package may determine a required color of light according to wavelengths of a light emitting device (e.g., a light emitting diode (LED) chip), and types and mixing ratios of phosphors, and when a determined color of light is white, a color temperature and a CRI thereof may be adjusted.

For example, when an LED chip emits blue light, a light emitting device package including at least one of yellow, green, and red phosphors may emit white light having a variety of color temperatures according to mixing ratios of the yellow, green, and red phosphors. In a different manner, a light emitting device package in which a green or red phosphor is applied to a blue LED chip may emit green or red light. As such, a combination of a light emitting device package which emits white light and a light emitting device package which emits green or red light may allow a color temperature and a CRI of white light to be adjusted. In addition, the light emitting device package may include at least one of light emitting devices which emit purple, blue, green, red and/or infrared light.

In this case, a lighting device may adjust a CRI of a sodium (Na) lamp, or the like, to the level of sunlight, and may also emit white light having various color temperatures from 1,500K to 20,000K. If necessary, the lighting device may emit purple, blue, green, red, and orange visible light or infrared light to adjust an illumination color according to a surrounding atmosphere or mood. The lighting device may also emit light having a certain wavelength stimulating plant growth.

White light generated by combining a blue light emitting device with yellow, green, and red phosphors and/or by combining at least one of a green light emitting devices and a red light emitting device, may have at least two peak wavelengths, and may be positioned in a segment linking (x, y) coordinates (0.4476, 0.4074), (0.3484, 0.3516), (0.3101, 0.3162), (0.3128, 0.3292), and (0.3333, 0.3333) of the CIE 1931 color space chromaticity diagram illustrated in FIG. 20. Alternatively, white light may be positioned in an area surrounded by the segment and a spectrum of blackbody radiation. A color temperature of the white light may range from 1,500K to 20,000K. As illustrated in FIG. 20, white light adjacent to Point E (0.3333, 0.3333) below the spectrum of the blackbody radiation may be used as a light source for lighting to create clearer viewing conditions for the naked eye while light having a yellow-based component is reduced. Thus, a lighting product using white light in the vicinity of Point E (0.3333, 0.3333) below the spectrum of the blackbody radiation may be useful as lighting for a retail space in which consumer goods are sold.

Figure 21:
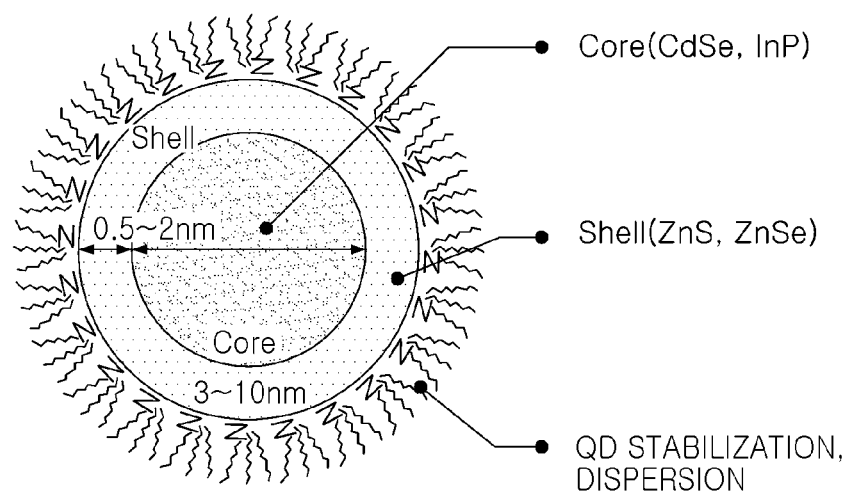
FIG. 21 is a view illustrating a wavelength conversion material which may be applied to a light emitting device package according to an example embodiment.

FIG. 21 is a view illustrating a wavelength conversion material which may be applied to a light emitting device package according to an example embodiment.

A wavelength conversion material may convert a wavelength of light emitted by a light emitting device, and may include various types of materials, such as a phosphor and a quantum dot (QD).

A phosphor may have the following empirical formulae and colors: yellow and green $Y_3Al_5O_{12}$:Ce, $Tb_3Al_5O_{12}$:Ce, $Lu_3Al_5O_{12}$:Ce (oxide-based); yellow and green $(Ba,Sr)_2SiO_4$:Eu, yellow and orange $(Ba,Sr)_3SiO_5$:Ce (silicate-based); green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(EU_zM_{1-z})_xSi_{12-y}Al_yO_{3+x+y}N_{18-x-y}$ (0.5≤x≤3, 0<z<0.3, 0<y≤4) (nitride-based), in which Ln may be at least one type of element selected from the group consisting of group IIIa elements and rare earth elements, and M may be at least one type of element selected from the group consisting of calcium (Ca), barium (Ba), strontium (Sr), and magnesium (Mg); and KSF-based red $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$Mn^{4+}$ (fluoride-based).

A phosphor composition should basically conform with stoichiometry, and respective elements thereof may be substituted with different elements in each groups on the periodic table. For example, strontium (Sr) may be substituted with barium (Ba), calcium (Ca), magnesium (Mg), or the like, of alkaline earth metals (group II), and yttrium (Y) may be substituted with terbium (Tb), lutetium (Lu), scandium (Sc), gadolinium (Gd), or the like, of lanthanides. In addition, europium (Eu), an activator, or the like, may be substituted with cerium (Ce), terbium (Tb), praseodymium (Pr), erbium (Er), ytterbium (Yb), or the like, according to desired energy levels. An activator may be applied alone, or an additional sub-activator, or the like, may be applied to modify characteristics.

In particular, a fluoride-based red phosphor may be coated with a fluoride not containing manganese (Mn), or may further include an organic coating on a surface of the fluoride-based red phosphor or on a surface of the fluoride-based red phosphor coated with a fluoride not containing manganese (Mn) to improve reliability at high temperatures and high humidity. Unlike other phosphors, the fluoride-based red phosphor may realize a narrow full width at half maximum (FWHM) equal to or less than 40 nm, and may thus be utilized in a high-resolution television, such as an ultra-high definition (UHD) television.

Table 1 below shows types of phosphors by application fields of a white light emitting device using a blue LED chip (wavelength: about 440 nm to 460 nm) or an ultraviolet (UV) LED chip (wavelength: about 380 nm to 430 nm).

TABLE 1

| Use | Phosphor |
|---|---|
| LED TV BACK LIGHT UNIT (BLU) | β-SiAlON:Eu2+, (Ca, Sr)AlSiN3:Eu2+, La3Si6N11:Ce3+, K2SiF6:Mn4+, SrLiAl3N4:Eu, Ln4 − x(EuzM1 − z)xSi12 − yAlyO3 + x + yN18 − x − y(0.5 ≤ x ≤ 3, 0 < z < 0.3, 0 < y ≤ 4), K2TiF6:Mn4+, NaYF4:Mn4+, NaGdF4:Mn4+, K3SiF7:Mn4+ |
| Lighting Device | Lu3Al5O12:Ce3+, Ca-α-SiAlON:Eu2+, La3Si6N11:Ce3+, (Ca, Sr)AlSiN3:Eu2+, Y3Al5O12:Ce3+, K2SiF6:Mn4+, SrLiAl3N4:Eu, Ln4 − x(EuzM1 − z)xSi12 − yAlyO3 + x + yN18 − x − y(0.5 ≤ x ≤ 3, 0 < z < 0.3, 0 < y ≤ 4), K2TiF6:Mn4+, NaYF4:Mn4+, NaGdF4:Mn4+, K3SiF7:Mn4+ |
| Side Viewing Screen (Mobile Device, Laptop PC, etc.) | Lu3Al5O12:Ce3+, Ca-α-SiAlON:Eu2+, La3Si6N11:Ce3+, (Ca, Sr)AlSiN3:Eu2+, Y3Al5O12:Ce3+, (Sr, Ba, Ca, Mg)2SiO4:Eu2+, K2SiF6:Mn4+, SrLiAl3N4:Eu, Ln4 − x(EuzM1 − z)xSi12 − yAlyO3 + x + yN18 − x − y(0.5 ≤ x ≤ 3, 0 < z < 0.3, 0 < y ≤ 4), K2TiF6:Mn4+, NaYF4:Mn4+, NaGdF4:Mn4+, K3SiF7:Mn4+ |
| Electronic Lighting Device (Headlamp, etc.) | Lu3Al5O12:Ce3+, Ca-α-SiAlON:Eu2+, La3Si6N11:Ce3+, (Ca, Sr)AlSiN3:Eu2+, Y3Al5O12:Ce3+, K2SiF6:Mn4+, SrLiAl3N4:Eu, Ln4 − x(EuzM1 − z)xSi12 − yAlyO3 + x + yN18 − x − y(0.5 ≤ x ≤ 3, 0 < z < 0.3, 0 < y ≤ 4), K2TiF6:Mn4+, NaYF4:Mn4+, NaGdF4:Mn4+, K3SiF7:Mn4+ |

In addition, quantum dots (QDs) may be used as wavelength conversion materials. Here, the QDs may be used to replace phosphors, or to be mixed with phosphors.

FIG. 21 is a cross-sectional view of a QD. The QD may have a core-shell structure using a group III-V compound semiconductor or a group II-VI compound semiconductor. For example, the QD may have a core, such as CdSe or InP, and a shell, such as ZnS or ZnSe. In addition, the QD may include a ligand stabilizing the core and the shell. For example, a diameter of the core may range from 1 nm to 30 nm, for example, from 3 nm to 10 nm. A thickness of the shell may range from 0.1 nm to 20 nm, for example, from 0.5 nm to 2 nm.

The QD may implement various colors according to sizes thereof, and in particular, when used as a phosphor substitute, may be employed as a red or green phosphor. When the QD is used, a narrow FWHM (for example, about 35 nm) may be implemented.

A wavelength conversion material may be contained in an encapsulant, or may be previously manufactured in a film form so as to be attached to a surface of an optical device, such as an LED chip or a light guide plate. When the wavelength conversion material previously manufactured in the film form is used, a wavelength conversion material having a uniform thickness may be easily implemented.

Figure 22:
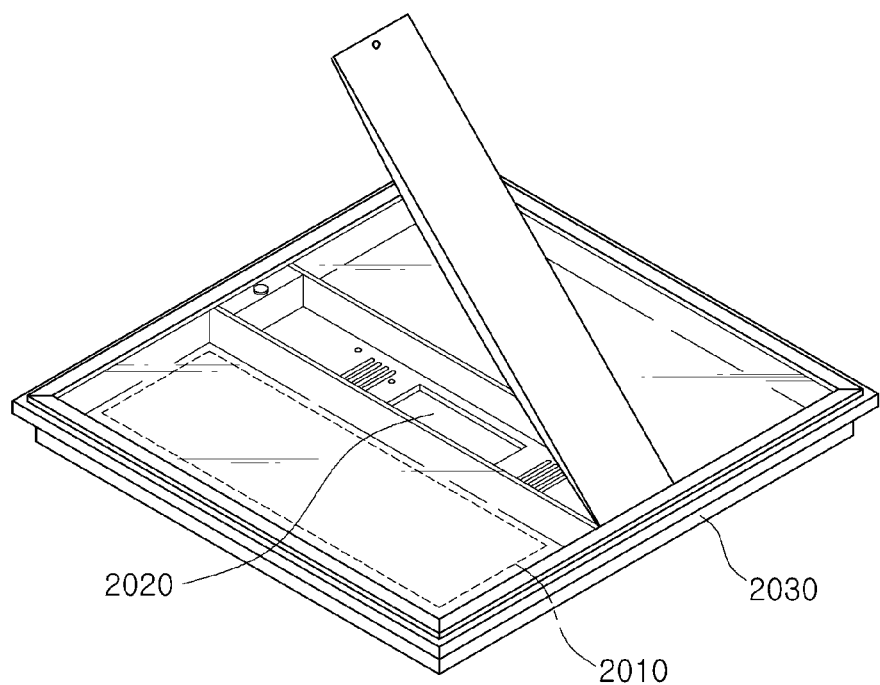
FIG. 22 is a schematic perspective view illustrating a flat panel lighting device to which a light emitting device package according to an example embodiment may be applied.

FIG. 22 is a schematic perspective view illustrating a flat panel lighting device to which a light emitting device package according to an example embodiment may be applied.

Referring to FIG. 22, a flat panel lighting device 2000 may include a light source module 2010, a power supply 2020, and a housing 2030. According to an example embodiment, the light source module 2010 may include a light emitting device array as a light source, and the power supply 2020 may include a light emitting device driver. For example, the flat panel lighting device 2000 according to an example embodiment illustrated in FIG. 22 may include a light emitting device package according to an example embodiment.

The light source module 2010 may include a light emitting device array, and have an overall planar shape. The power supply 2020 may be configured to supply power to the light source module 2010. The housing 2030 may have a space to receive the light source module 2010 and the power supply 2020 therein, and may have a hexahedral shape with an open side surface thereof, but is not limited thereto. The light source module 2010 may emit light to the open side surface of the housing 2030.

Figure 23:
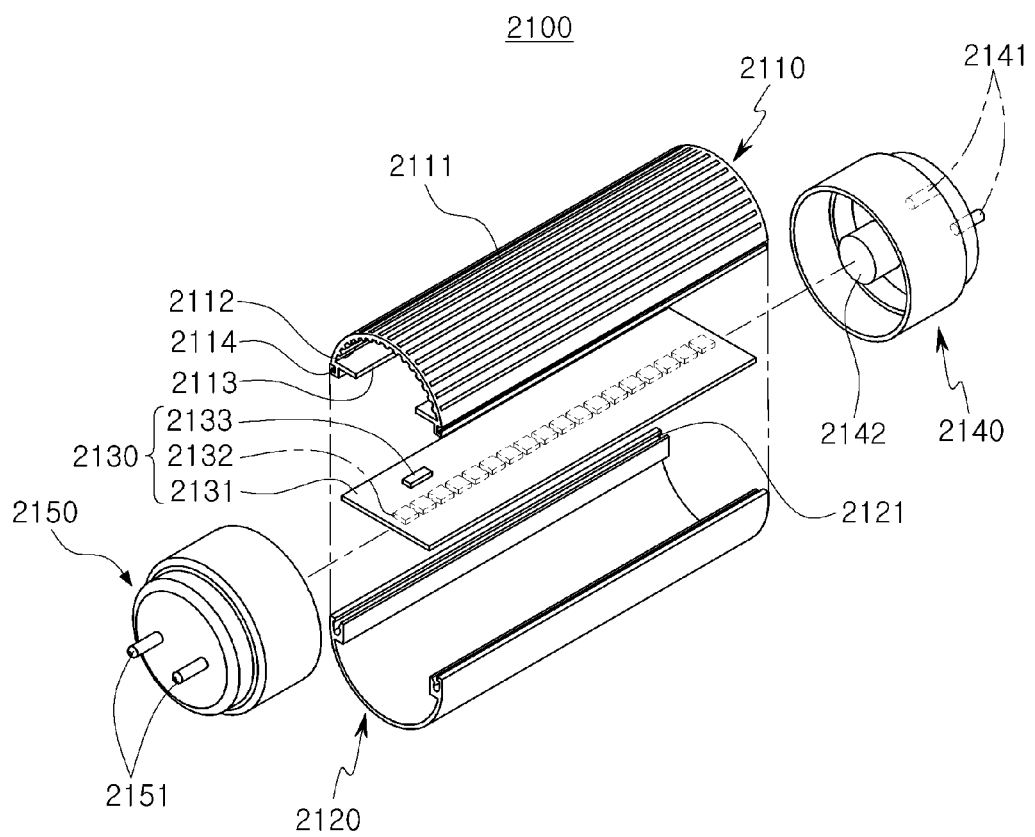
FIG. 23 is a schematic exploded perspective view illustrating a bar-type lamp as a lighting device to which an LED driving device according to an example embodiment may be applied.

FIG. 23 is a schematic exploded perspective view illustrating a bar-type lamp as a lighting device to which an LED driving device according to an example embodiment may be applied.

Referring to FIG. 23, a lighting device 2100 may include a heat sink 2110, a cover 2120, a light source module 2130, a first socket 2140, and a second socket 2150. A plurality of heat sink fins 2111 and 2112 may be formed in an uneven pattern on an internal and/or external surface of the heat sink 2110, and may be designed to have various shapes and intervals. The heat sink 2110 may have protruding supports 2113 formed on an inside thereof. The light source module 2130 may be fixed to the protruding supports 2113. The heat sink 2110 may have protrusions 2114 formed on opposite ends thereof.

The cover 2120 may have grooves 2121 formed therein, and protrusions 2114 of the heat sink 2110 may be coupled to the grooves 2121 by a hook coupling structure. Positions of the grooves 2121 and the protrusions 2114 may be reversed.

The light source module 2130 may include a light emitting device array. The light source module 2130 may include a PCB 2131, light sources 2132, and a controller 2133. As described above, the controller 2133 may store driving information of the light sources 2132. The PCB 2131 may have circuit wirings formed thereon to operate the light sources 2132. The PCB 2131 may include components operating the light sources 2132.

The first and second sockets 2140 and 2150, as a pair of sockets, may have a structure in which the first and second sockets 2140 and 2150 may be coupled to both ends of a cylindrical cover unit including the heat sink 2110 and the cover 2120. For example, the first socket 2140 may include electrode terminals 2141 and a power supply 2142, and the second socket 2150 may include dummy terminals 2151 disposed thereon. In addition, one of the first and second sockets 2140 or 2150 may have an optical sensor and/or a communications module embedded therein. For example, the second socket 2150 having the dummy terminals 2151 disposed thereon may have an optical sensor and/or a communications module embedded therein. Alternatively, the first socket 2140 having the electrode terminals 2141 disposed thereon may have an optical sensor and/or a communications module embedded therein.

Figure 24:
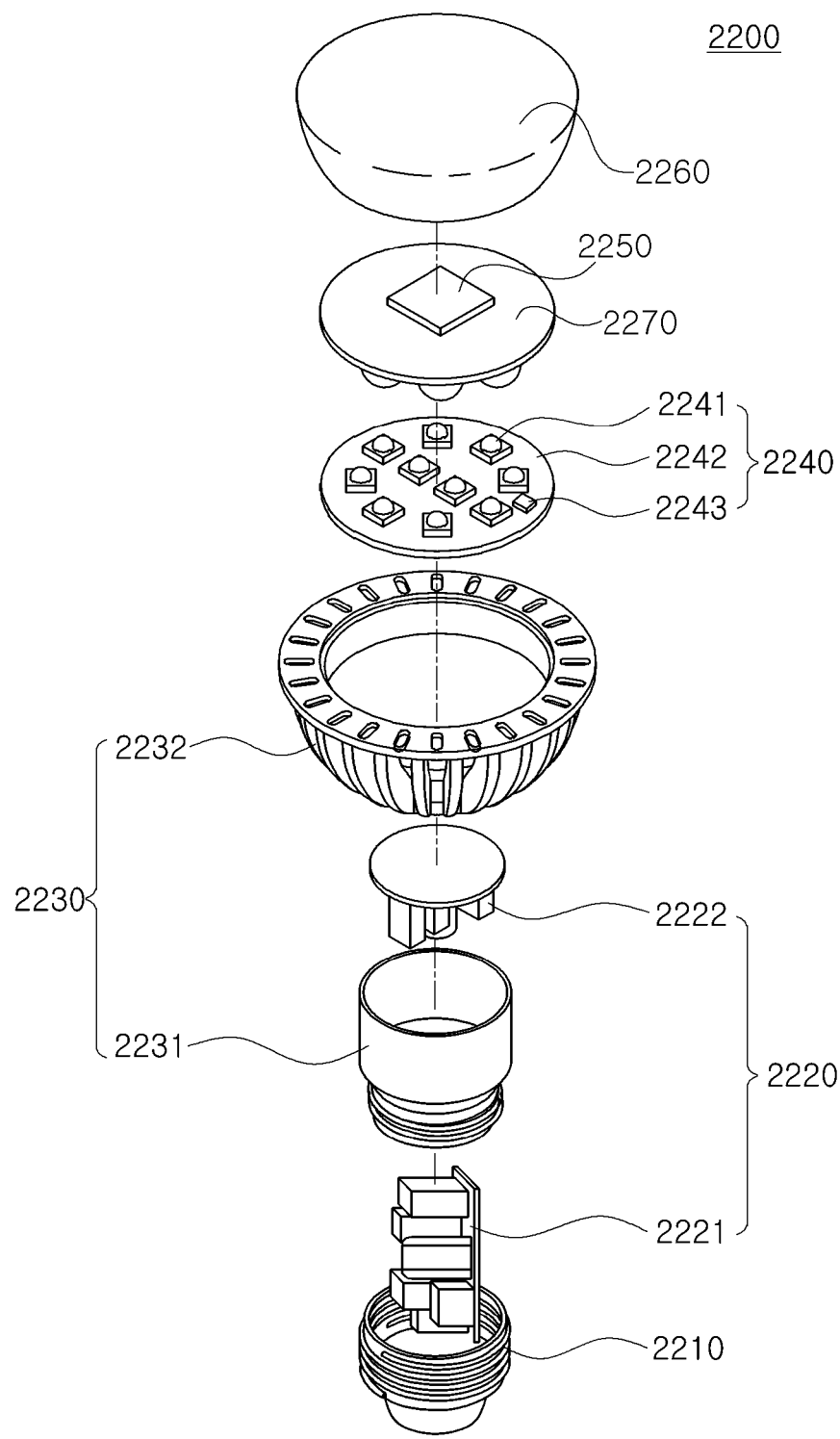
FIG. 24 is a schematic exploded perspective view illustrating a bulb-type lamp as a lighting device to which a light emitting device package according to an example embodiment o may be applied.

FIG. 24 is a schematic exploded perspective view illustrating a bulb-type lamp as a lighting device to which a light emitting device package according to an example embodiment may be applied.

Referring to FIG. 24, a lighting device 2200 may include a socket 2210, a driver circuit 2220, a heat sink 2230, a light source module 2240, and an optical unit 2250. According to an example embodiment, the light source module 2240 may include a light emitting device array, and the driver circuit 2220 may include a rectifier circuit, a direct current-direct current (DC-DC) converter, a direct-coupled alternating current (AC) driver circuit, or the like. The socket 2210 may be included above the light source 2240, and may reduce glare by evenly diffusing light, emitted by the light source 2240, to the side and rear of the socket 2210.

The socket 2210 may be configured to replace that of a conventional lighting device. Power supplied to the lighting device 2200 may be applied through the socket 2210. As illustrated in FIG. 24, the driver circuit 2220 may be attached to a first driver circuit 2221 and a second driver circuit 2222. The heat sink 2230 may include an internal heat sink 2231 and an external heat sink 2232. The internal heat sink 2231 may be directly connected to the light source 2240 and/or the driver circuit 2220 to transfer heat to the external heat sink 2232. The optical unit 2250 may include an internal optical portion (not illustrated) and an external optical portion (not illustrated), and may be configured to evenly scatter light emitted by the light source module 2240.

The light source module 2240 may receive power from the driver circuit 2220 to emit light to the optical unit 2250. The light source module 2240 may include at least one light emitting device 2241, a circuit board 2242, and a controller 2243 which may store driving information of the at least one light emitting device 2241. The controller 2243 may detect power, supplied through the socket 2210, to determine whether a plurality of LEDs included in the light source module 2240 are defective.

A communications module 2250 may be mounted on an upper portion of the light source module 2240, and may perform home network communications. For example, the communications module 2220 may be a wireless communications module using Zigbee®, wireless fidelity (Wi-Fi), or light fidelity (Li-Fi), and may control on and off functions, brightness, or the like, of a light installed in and around a home through a smartphone or a wireless controller. In addition, by using a Li-Fi communications module using a visible light wavelength of a lighting device installed in and around residential, commercial or industrial spaces may control electronics, such as a television, a refrigerator, an air-conditioner, a door lock, or may control a vehicle.

The light source module 2240 and the communications module 2250 may be covered by the optical unit 2260. The communications module 2250 may be implemented with the controller 2243 and a single integrated circuit (IC). The controller 2243 may be provided as a module separate from the light source 2240.

As set forth above, according to example embodiments, a package substrate may include a plurality of mounting regions and a plurality of connecting lines formed on a surface of a base substrate, in which at least one of the plurality of connecting lines may be selectively connected to other connecting lines, other mounting regions, or the like, or separated therefrom, by a wire. Accordingly, connection structures for light emitting devices mounted on the package substrate may be changed, and a light emitting device package that may meet various operating conditions may be provided without a redesign of the package substrate.

While example embodiments have been shown and described above, it will be apparent to those skilled in the art that modifications and variations could be made without departing from the scope of the inventive concept as defined by the appended claims.

What is claimed is:

1. A package substrate comprising:
   a base substrate having a plurality of mounting regions and a plurality of unit light emitting regions which include at least one of the plurality of mounting regions;
   a plurality of first circuit patterns disposed on the base substrate and connected to electrodes of a plurality of light emitting devices in the plurality of mounting regions;
   a plurality of second circuit patterns disposed on the base substrate and connected to the plurality of unit light emitting regions; and
   a wire electrically connecting the plurality of second circuit patterns to the plurality of second circuit patterns, each of the plurality of second circuit patterns being connected to different unit light emitting regions, or electrically connecting the plurality of first circuit patterns to the plurality of second circuit patterns.

2. The package substrate of claim 1, wherein numbers of the plurality of mounting regions included in each of the plurality of unit light emitting regions are equal to each other.

3. The package substrate of claim 1, wherein each of the plurality of mounting regions is included in any one of the plurality of unit light emitting regions.

4. The package substrate of claim 1, wherein the plurality of unit light emitting regions have the same shape.

5. The package substrate of claim 1, wherein at least portions of the plurality of unit light emitting regions have different shapes.

6. The package substrate of claim 1, wherein portions of the plurality of second circuit patterns are disposed between the plurality of mounting regions.

7. The package substrate of claim 1, wherein portions of the plurality of second circuit patterns have a length greater than a width of each of the plurality of mounting regions.

8. The package substrate of claim 1, wherein the wire does not overlap the plurality of unit light emitting regions.

9. The package substrate of claim 1, wherein the wire has a length shorter than a length of each of the plurality of second circuit patterns.

10. The package substrate of claim 1, wherein at least one of the plurality of second circuit patterns electrically connects the plurality of first circuit patterns, included in any one of the plurality of unit light emitting regions, to each other.

11. A light emitting device package comprising:
    a plurality of light emitting devices; and
    a package substrate having a plurality of first circuit patterns which provides a plurality of unit light emitting regions in which the plurality of light emitting devices are disposed, the plurality of first circuit patterns being disposed on the package substrate and connected to electrodes of the plurality of light emitting devices, a plurality of second circuit patterns disposed on the package substrate and connected to at least one of the plurality of first circuit patterns, and a wire connecting at least one of the plurality of second circuit patterns to at least one of the plurality of first circuit patterns and the plurality of second circuit patterns.

12. The light emitting device package of claim 11, wherein numbers of the plurality of light emitting devices disposed in each of the plurality of unit light emitting regions are equal to each other.

13. The light emitting device package of claim 11, wherein at least portions of the plurality of light emitting devices disposed in the plurality of unit light emitting regions are electrically connected to each other by the plurality of second circuit patterns.

14. The light emitting device package of claim 11, wherein the wire has a length shorter than lengths of the plurality of second circuit patterns.

15. The light emitting device package of claim 11, wherein the plurality of light emitting devices are connected to the plurality of first circuit patterns in the plurality of unit light emitting regions by a flip-chip bonding.

16. A package substrate comprising:
- a base substrate having a plurality of mounting regions and a plurality of unit light emitting regions which include at least one of the plurality of mounting regions;
- a plurality of first circuit patterns disposed on the base substrate and connected to electrodes of a plurality of light emitting devices in the plurality of mounting regions;
- a plurality of second circuit patterns disposed on the base substrate and connected to the plurality of unit light emitting regions; and
- a wire selectively connecting the plurality of second circuit patterns to the plurality of second circuit patterns or to the plurality of first circuit patterns.

17. The package substrate of claim 16, wherein the wire electrically connects the plurality of second circuit patterns to the plurality of second circuit patterns, each of the plurality of second circuit patterns being connected to different unit light emitting regions, or electrically connects the plurality of second circuit patterns to the plurality of first circuit patterns.

18. The package substrate of claim 16, wherein the plurality of unit light emitting regions have the same shape.

19. The package substrate of claim 16, wherein at least portions of the plurality of unit light emitting regions have different shapes.

20. The package substrate of claim 16, wherein at least portions of the plurality of unit light emitting regions are connected to one of power patterns receiving power supply voltage, through at least one of the plurality of first circuit patterns.

* * * * *